(12) United States Patent
Morimoto

(10) Patent No.: US 6,933,732 B2
(45) Date of Patent: Aug. 23, 2005

(54) CAPACITANCE TYPE SENSOR

(75) Inventor: Hideo Morimoto, Yamatokooriyama (JP)

(73) Assignee: Nitta Corporation, Osaka (JP)

( * ) Notice: Subject to any disclaimer, the term of this patent is extended or adjusted under 35 U.S.C. 154(b) by 0 days.

(21) Appl. No.: 10/471,445

(22) PCT Filed: May 17, 2001

(86) PCT No.: PCT/JP01/04098
§ 371 (c)(1),
(2), (4) Date: Sep. 10, 2003

(87) PCT Pub. No.: WO02/073147
PCT Pub. Date: Sep. 19, 2002

(65) Prior Publication Data
US 2004/0080216 A1 Apr. 29, 2004

(30) Foreign Application Priority Data

Mar. 14, 2001 (JP) .......................................... 2001-71668

(51) Int. Cl.[7] .............................................. G01R 27/26
(52) U.S. Cl. ................... 324/661; 324/662; 73/862.043
(58) Field of Search ................................ 324/661, 662; 73/862.043

(56) References Cited

U.S. PATENT DOCUMENTS 5,367,199 A   11/1994   Lefkowitz et al. .......... 307/116
6,530,283 B2 *  3/2003   Okada et al. .................. 73/780

FOREIGN PATENT DOCUMENTS

JP    11-132872   5/1999   ............. G01L/1/14
JP     3069594    3/2000   ............ H01H/13/52

* cited by examiner

Primary Examiner—Anjan Deb
Assistant Examiner—Timothy J. Dole
(74) Attorney, Agent, or Firm—Osha Liang LLP

(57) ABSTRACT

A movable switch electrode (E21) which is contactable with a capacitance element electrode (E1) formed on a substrate (20) and is spaced apart from a fixed switch electrode (E11) formed in an interior of the capacitance element electrode (E1) and having a domed form to cover the fixed switch electrode (E11) is set in place. When a detective member (30) is operated and a force applied from a displacement electrode (40) to the movable switch electrode (E21) reaches a specified value, the movable switch electrode (E21) is elastically deformed and depressed drastically with buckling at the nearly top portion thereof and is brought into contact with the fixed switch electrode (E11). This brings the switch into the ON-state. At this time, an operator is given a pronounced click feeling.

16 Claims, 22 Drawing Sheets

CAPACITANCE TYPE SENSOR

This application is a national phase application of PCT International Application Number PCT/JP01/04098, filed on May 17, 2001, which claims priority on Japanese Application Number 2001-71668, filed Mar. 14, 2001.

TECHNICAL FIELD

The present invention relates to a capacitance type sensor suitably used for inputting operation of multidimensional direction and, more particularly to, a capacitance type sensor that can provide a click feeling to an operator when performing the operation.

BACKGROUND ART

A capacitance type sensor is used as a device for converting magnitude and direction of a force applied by an operator into electric signal. For example, a device incorporating the capacitance type force sensor for inputting operation of multidimensional direction is used as an input device of game console (a so-called joystick).

A capacitance type sensor can be used to input an operation having a specified dynamic range as a magnitude of a force applied by an operator. It can also be used as a 2-dimensional or 3-dimensional sensor capable of dividing an applied force into respective dimensional components, for force detection. Among others, a capacitance type force sensor having a capacitance element formed by two electrodes to detect an applied force on the basis of changes of capacitance values caused by variations of distance between the electrodes is now in practical use in a variety of fields in terms of the advantage that the structure can be simplified to reduce costs.

For example, Japanese Laid-open (Unexamined) Patent Publication No. Hei 7(1995)-200164 discloses a capacitance type force sensor 510 as shown in FIG. 22. The capacitance type force sensor 510 has a substrate 520, an elastic rubber plate 530 disposed over the substrate 520, an electrode part 540 disposed on a lower surface of the elastic rubber plate 530, an electrode part 500–504 arranged on an upper surface of the substrate 520 (See FIG. 23), a presser plate 560 for fixedly supporting the elastic rubber plate 530 to the substrate 520, and an electronic device 580 arranged on a lower surface of the substrate 520. The electrode part 500–504 comprises four electrodes 501–504 arranged to be symmetric with respect to an origin, and an annular electrode 500 arranged around the outside of those electrodes, as shown in FIG. 23. The periphery of the electrode part 540 is in contact with the electrode 500 connected to ground and thus is connected to ground through the electrode 500.

When an operator presses down the elastic rubber plate 530, the electrode part 540 is displaced downwardly increasingly with the displacement force, so that the distances between the electrode part 540 and the four electrodes 501–504 are changed. Then, the capacitance values of the capacitance elements formed between the four electrodes 501–504 and the electrode part 540 are changed. By detecting the changes of the capacitance values, magnitude and direction of the force applied by the operator can be recognized.

However, the force sensor 510 shown in FIGS. 22 and 23 has the disadvantage that although when an operator presses down the elastic rubber plate 530, the electrode part 540 is displaced downwardly with the pressing force, since the amount of displacement of the electrode part 540 varies substantially in proportion to the pressing force, the operator is not given a pronounced click feeling virtually. Accordingly, the operator often carries out the operation without feeling that he/she is actually carrying out the operation. The operator cannot easily comprehend that he/she is actually carrying out the operation, unless he/she visually recognizes the operation of an operated object of the force sensor 510.

Accordingly, it is the object of the present invention to provide a capacitance type sensor that can make it easy for an operator to sensuously comprehend that he/she is actually carrying out the operation.

DISCLOSURE OF THE INVENTION

The present invention provides a novel capacitance type sensor comprising a substrate for determining an XY plane in a defined XYZ three-dimensional coordinate system, a detective member being opposite to the substrate, a conductive member disposed between the substrate and the detective member, the conductive member being displaceable in a Z-axis direction as the detective member is displaced in a Z-axis direction, a reference electrode formed on the substrate and electrically connected with the conductive member, the reference electrode being grounded or kept at a fixed potential, a first electrode formed on the substrate, a second electrode formed on the substrate to constitute a first capacitance element with the conductive member, and a third electrode arranged to be contactable with the second electrode and spaced apart from the first electrode, the third electrode being elastically deformable with a click feeling along with displacement of the conductive member, to contact with the first electrode. In the capacitance type sensor according to the first aspect of the invention, when the first electrode and the third electrode are in contact with each other, signal input to the first electrode can be used to recognize displacement of the detective member on the basis of detection of changes in capacitance values of the first capacitance element caused by variations of distances between the conductive member and the second electrode.

In order that the third electrode can be elastically deformed with a click feeling to contact with the first electrode, the third electrode is formed of material that can allow the third electrode to be displaced in the direction of the first electrode at an increased displacement speed (preferably drastically) when an external force above a certain level is applied to the third electrode. In other words, it is formed of material that can produce an increased displacement speed when an external force applied is above a certain level, as compare with a displacement speed at which the third electrode is displaced in the direction of the first electrode when the external force applied is below the certain level (the displacement speed may be zero).

According to this construction, when an operator operates the detective member, the third electrode corresponding to the operating direction is elastically deformed with a click feeling and also the capacitance type sensor does not recognize the displacement of the detective member until the third electrode is contacted with the first electrode. Therefore, the operator can easily comprehend from a click feeling that he/she is actually carrying out the operation. Also, since the capacitance type sensor does not recognize the displacement of the detective member until an external force enough to make the operator feel a click is applied to the detective member, when the operator unintentionally or unconsciously applies to the detective member an external force which is too small for the operator to feel a click, the capacitance type sensor does not recognize the displacement of the detective member. Therefore, a possible disturbance, such as a happening that the detective member happen to contact with another member, is avoided, so that only the displacement of the detective member caused by the operator's intentional operation is surely detected.

In the capacitance type sensor of the present invention, the third electrode has a domed form, in an interior of which the first electrode may be arranged. According to this construction, when a force applied from the conductive member reaches a predetermined value, the third electrode of the domed form is drastically displaced and depressed at a nearly top portion thereof and then is brought into contact with the first electrode. This can give the operator a distinct click feeling.

In the capacitance type sensor of the present invention, a second capacitance element may be formed between the reference electrode and the conductive member. According to this construction, the conductive member is electrically connected with the reference electrode grounded or held at a fixed potential via a capacitive coupling, not via a direct contact. This can provide an improved withstand voltage of the capacitance type sensor, thus practically eliminating the possibility that the sensor may be damaged by a spark current flowing through the sensor, and also can prevent a possible failure such as a bad connection. Therefore, the capacitance type sensor with improved reliability can be obtained. Also, even when an insulating film is arranged between the reference electrode and the conductive member, since there is no need to cut part of the insulating film to bring the reference electrode and the conductive member into contact with each other, advantageous effects can be produced in assembly and mounting aspects.

In the capacitance type sensor of the present invention, there may be provided two or more groups of the first, second and third electrodes. According to this construction, multidimensional force recognition can be made by using the respective groups of electrodes to recognize the forces for different directions.

In the capacitance type sensor of the present invention, there may be provided two groups of the first, second and third electrodes, and signals with different phases may be fed to a circuit including one of the two groups of electrodes and a circuit including the other of the two groups of electrodes. According to this construction, whether or not the circuit including one of the two groups of electrodes and the circuit including the other of the two groups of electrodes are identical in time constant with each other, the displacement of the detective member can be recognized.

In the capacitance type sensor of the present invention, there may be provided two groups of the first, second and third electrodes, and a CR circuit including one of the two groups of electrodes and a CR circuit including the other of the two groups of electrodes are different in time constant from each other. According to this construction, since the phase lag of the signal passing through the circuit can be increased, the displacement of the detective member can be recognized with improved precision. Also, an increased displacement detectable range of the detective member can be provided.

In the capacitance type sensor of the present invention, it is preferable that there is provided two groups of the first, second and third electrodes, and output signals of signals input to the circuit including one of the two groups of electrodes and the circuit including the other of the two groups of electrodes, respectively, are detected by a signal processing circuit using a logical element that performs any of an exclusive-OR logical operation, a logical operation OR, a logical operation AND and a NOT operation. According to this construction, the output signal can be detected with improved precision. Further, the detection precision can be adjusted according to need.

Further, in the capacitance type sensor of the present invention, the second electrode may include a pair of fourth electrodes arranged to be symmetric with respect to a Y-axis and a pair of fifth electrodes arranged to be symmetric with respect to an X-axis. According to this construction, the X-axis direction components and Y-axis direction components of the force applied to the detective member from outside can be recognized separately.

In the capacitance type sensor of the present invention, it is preferable that the detective member is divided to correspond to the fourth electrodes and the fifth electrodes, respectively. According to this construction, since the components of the external force for the X-axis direction and the components of the external force for the Y-axis direction are distinctly separated. This can prevent the components of the forces for the different directions from being interfered with each other, thus reducing possible wrong operation.

The capacitance type sensor of the present invention may further comprise a sixth electrode formed on the substrate, and a seventh electrode arranged to be contactable with the reference electrode and spaced apart from the sixth electrode, the seventh electrode being elastically deformable along with displacement of the conductive member, to contact with the sixth electrode. According to this construction, since the capacitance type sensor further comprises the sixth electrode and the seventh electrode that can be contacted with each other by the operation of the detective member, a switch used for performing the determinate operation for input can be added, in addition to the effects mentioned above being provided.

In the capacitance type sensor of the present invention, the detective member is preferably divided to correspond to the second electrodes and the sixth electrodes, respectively. According to this construction, since the external force applied from the side corresponding to the operating direction and the external force applied from the side corresponding to the determinate direction are distinctly separated, those forces can be prevented from being interfered with each other, thus reducing possible wrong operation.

In the capacitance type sensor of the present invention, the conductive member may be formed by conductive ink applied to an elastic member. According to this construction, the conductive member can be easily produced and thus the production costs can be reduced.

BEST MODE FOR CARRYING OUT THE INVENTION

In the following, certain preferred embodiments of the present invention are described with reference to the accompanying drawings. The capacitance type sensors according to the preferred embodiments of the present invention described below are used as a force sensor.

Figure 1:
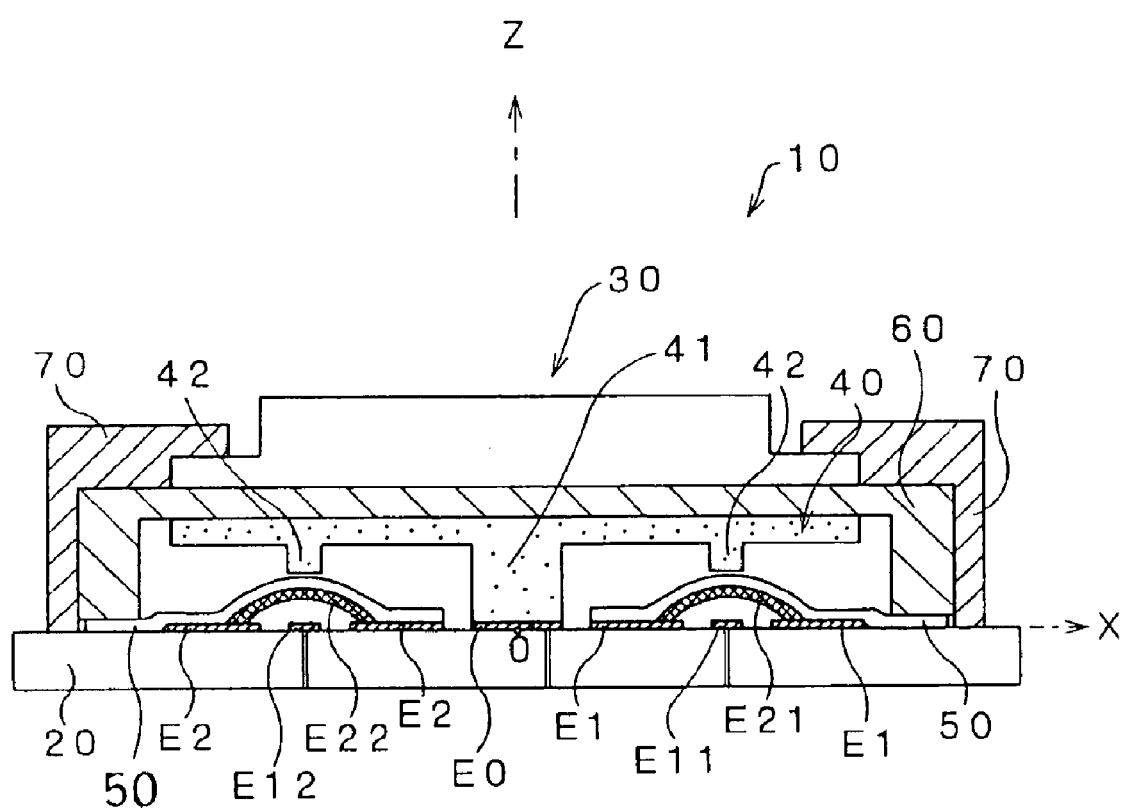
FIG. 1 is a schematic sectional view of a capacitance type sensor according to the first embodiment of the present invention.
Figure 2:
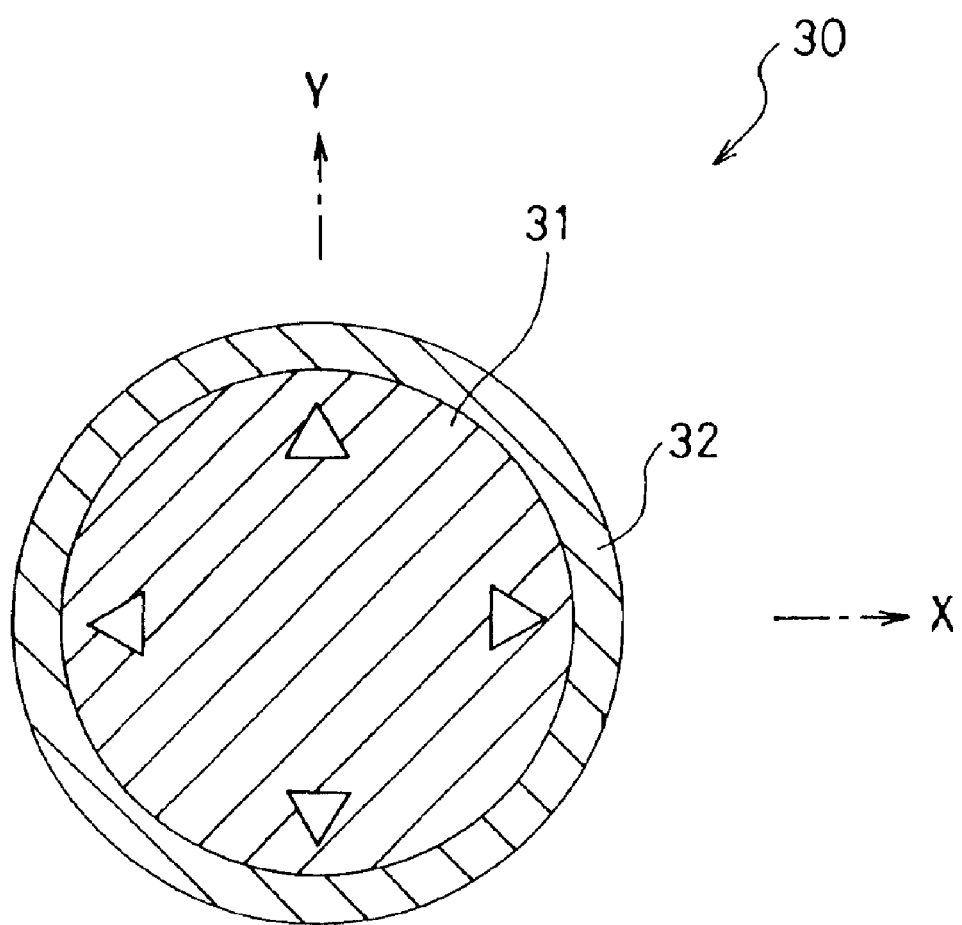
FIG. 2 is a top view of a detective member of the capacitance type sensor of FIG. 1.
Figure 3:
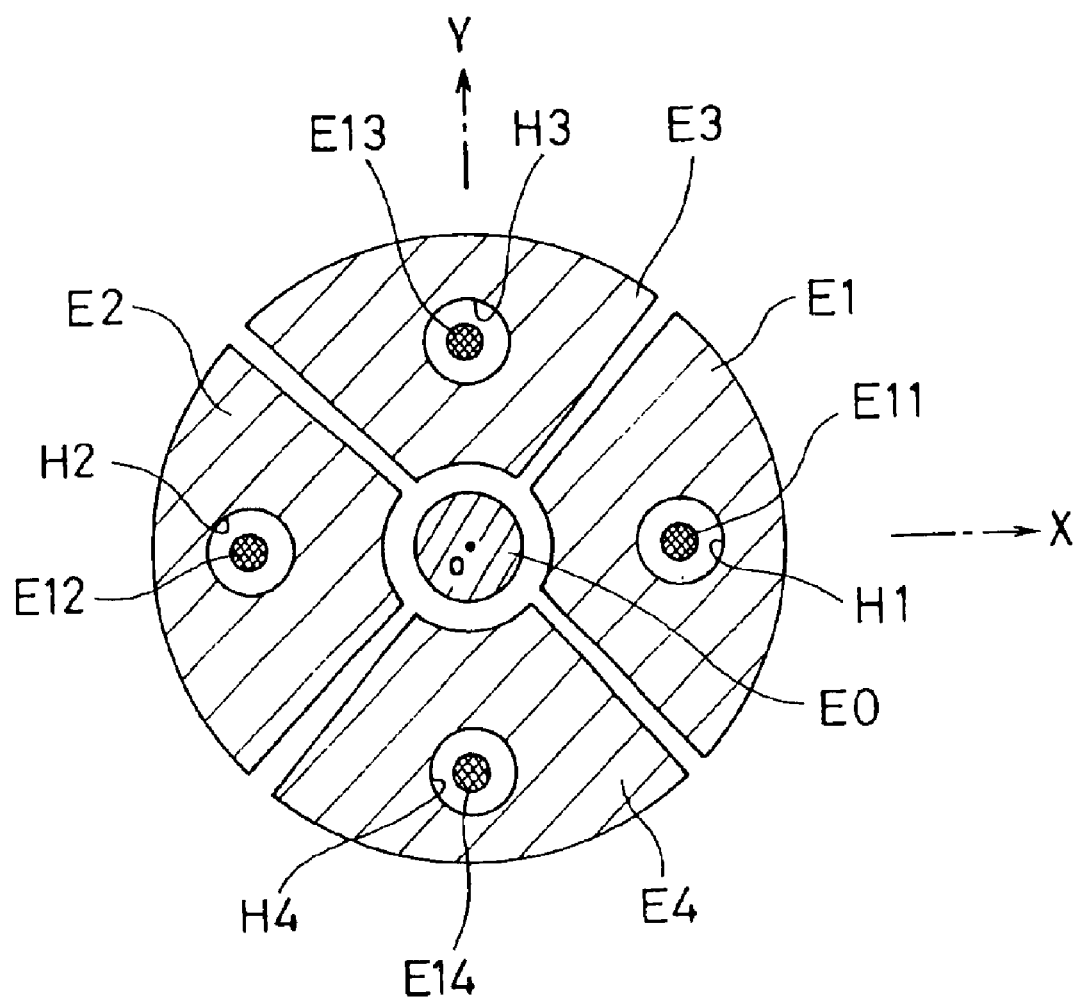
FIG. 3 is a view showing an arrangement of a plurality of electrodes formed on a substrate of the capacitance type sensor of FIG. 1.

FIG. 1 is a schematic sectional view of a capacitance type sensor according to the first embodiment of the present invention. FIG. 2 is a top view of a detective member of the capacitance type sensor of FIG. 1. FIG. 3 is a view showing an arrangement of a plurality of electrodes formed on a substrate of the capacitance type sensor of FIG. 1.

The capacitance type sensor 10 has a substrate 20, an operating detective member 30 to which a force is applied from outside by an operator, a displacement electrode 40, capacitance element electrodes E1–E4 formed on the substrate 20, movable switch electrodes E21–E24 having a domed shape formed on the substrate 20 (only E21 and E22 are shown in FIG. 1), fixed switch electrodes E11–E14 arranged in the inside of the movable switch electrodes E21–E24, respectively (only E11 and E12 are shown in FIG. 1), a reference electrode (common electrode) E0, an insulating film 50 formed to be laid over the substrate 20 so as to be closely contacted with the plurality of electrodes, a supporting member 60 for fixedly supporting the detective member 30 and the displacement electrode 40 on the substrate 20, and a cover case 70 arranged to cover peripheries of the supporting member 60 and the detective member 30.

For convenience of explanation, a XYZ three-dimensional coordinate system is defined herein, as illustrated, and the placement of the parts will be described with reference to this coordinate system. That is to say, in FIG. 1, the origin O is defined at the center of the reference electrode E0 on the substrate 20, letting the X-axis be in a horizontally rightward direction, the Z-axis be in a vertically upward direction, and the Y-axis be in a depth direction orthogonal to the vertical direction, when viewed from the paper. Therefore, a surface of the substrate 20 defines a plane XY, and the Z-axis passes substantially center positions of the reference electrode E0, the detective member 30 and the displacement electrode 40.

The substrate 20 is a printed circuit board for an electronic circuit of a general type. In the illustrated example, a glass-epoxy substrate is used as the substrate. Although a film substrate formed, for example, of a polyimide film may be used as the substrate 20, since it has a nature of flexibility, it is preferably used in combination with a supporting board having sufficient rigidity on which the film substrate is placed.

The detective member 30 comprises an upper, small-diameter portion 31 serving as a force receiving portion and a lower, large-diameter portion 32 extending to a lower end portion of the upper portion 31. The detective member 30 is formed in a disc-like form on the whole. The diameter of the upper portion 31 is smaller than a diameter of a circle formed by connecting outer curved lines of the capacitance element electrodes E1–E4. The diameter of the lower portion 32 is substantially equal to a diameter of a circle formed by connecting the outer curved lines of the capacitance element electrodes E1–E4. A resin cap may be capped on the detective member 30, in order to provide improved operationality.

The detective member 30 has arrows formed on an upper surface of the upper portion 31, as shown in FIG. 2, to indicate operating directions (moving directions of a cursor). The arrows are oriented to the X-axis positive/negative direction and the Y-axis positive/negative direction, respectively, or are formed to correspond to the capacitance element electrodes D1–D4, respectively.

The displacement electrode 40 is formed of silicon rubber having conducting properties and is formed in a disc-like form having a diameter substantially equal to the diameter of the circle formed by connecting the outer curved lines of the capacitance element electrodes E1–E4. The displacement electrode 40 is adhesive bonded to a lower surface of the supporting member 60 formed of silicon rubber having elasticity. The displacement electrode 40 has, on its lower surface, a protrusion 41 formed to protrude downwardly at a center position thereof and have a circular shape of a diameter equal to a diameter of the reference electrode E0.

The protrusion 41 has a height enough for a lower surface thereof to contact with the reference electrode E0. As described above, since the protrusion 41 is formed at the center of the displacement electrode 40, the displacement electrode 40 can be tilted with the protrusion 41 as the fulcrum when a force acts on the detective member 30. The displacement electrode 40 has four protrusions 42 formed at the positions corresponding to the fixed switch electrodes E11–E14, respectively.

The displacement electrode 40 may be formed, for example, of conductive ink, conductive thermosetting resin (PPT, elastomer), conductive plastic, and metal evaporated film, as well as of silicon rubber. It is to be noted that the protrusion 42 of the displacement electrode 40 is not indispensable.

As shown in FIG. 3, the reference electrode E0 of a circular form with center at the origin O, the capacitance element electrodes E1–E4 of a sector form arranged around the outside of the reference electrode E0 and having circular holes H1–H4 formed around center portions thereof, and fixed switch electrodes E11–E14 of a circular form formed in the interior of the holes H1–H4 respectively and having diameter smaller than diameter of the holes H1–H4 are formed on the substrate 20. It is preferable that the fixed switch electrodes E11–E14 have as small area as possible, as compared with the area of the capacitance element electrodes E1–E4. A pair of capacitance element electrodes E1 and E2 are arranged in isolation with respect to the X-axis direction so as to be symmetric with respect to the Y-axis. A pair of capacitance element electrodes E3 and E4 are arranged in isolation with respect to the Y-axis direction so as to be symmetric with respect to the X-axis. The reference electrode E0 may be arranged around the outside of the capacitance element electrodes E1–E4. In this case, the protrusion 41 of the displacement element 40 will be formed around the outside of the capacitance element electrodes E1–E4.

The capacitance element electrode E1 is arranged to correspond to the X-axis positive direction, and the capacitance element electrode E2 is arranged to correspond to the X-axis negative direction. The E1 and E2 are used for detecting components of a force applied from outside for the X-axis direction. The capacitance element electrode E3 is arranged to correspond to the Y-axis positive direction, and the capacitance element electrode E4 is arranged to correspond to the Y-axis negative direction. The E3 and E4 are used for detecting components of a force applied from outside for the Y-axis direction.

The reference electrode E0 and the fixed switch electrodes E11–E14 are connected to terminals T0–T5 through the use of through holes and the like (See FIG. 4) and are connected to exterior electronic circuits through the terminals T0–T5. The reference electrode E0 is connected to ground through the terminal T0.

The movable switch electrodes E21–E24 are arranged in such a relation that they contact with the capacitance element electrodes E1–E4, respectively, but are spaced apart from and cover the fixed switch electrodes E11–E14. Thus, the movable switch electrodes E21–E24 are domed members having a diameter larger than a diameter of the holes H1–H4.

The insulating film 50 is laid over the substrate 20 in such a relation that it is closely contacted with a part of the capacitance element electrodes E1–E4 and the movable switch electrodes E21–E24 on the substrate 20. Thus, the insulating film 50 prevents the covered parts of the capacitance element electrodes E1–E4 and movable switch electrodes E21–E24 formed from copper and the like from being exposed to air and accordingly it has the function of preventing oxidization of those electrodes. Alternative anti-oxidization measurement such as gold plate may be given to the capacitance element electrodes E1–E4 and movable switch electrodes E21–E24. Also, the insulating film 50 prevents a direct contact between the capacitance element electrodes E1–E4 and movable switch electrodes E21–E24 and the displacement electrode 40.

Figure 4:
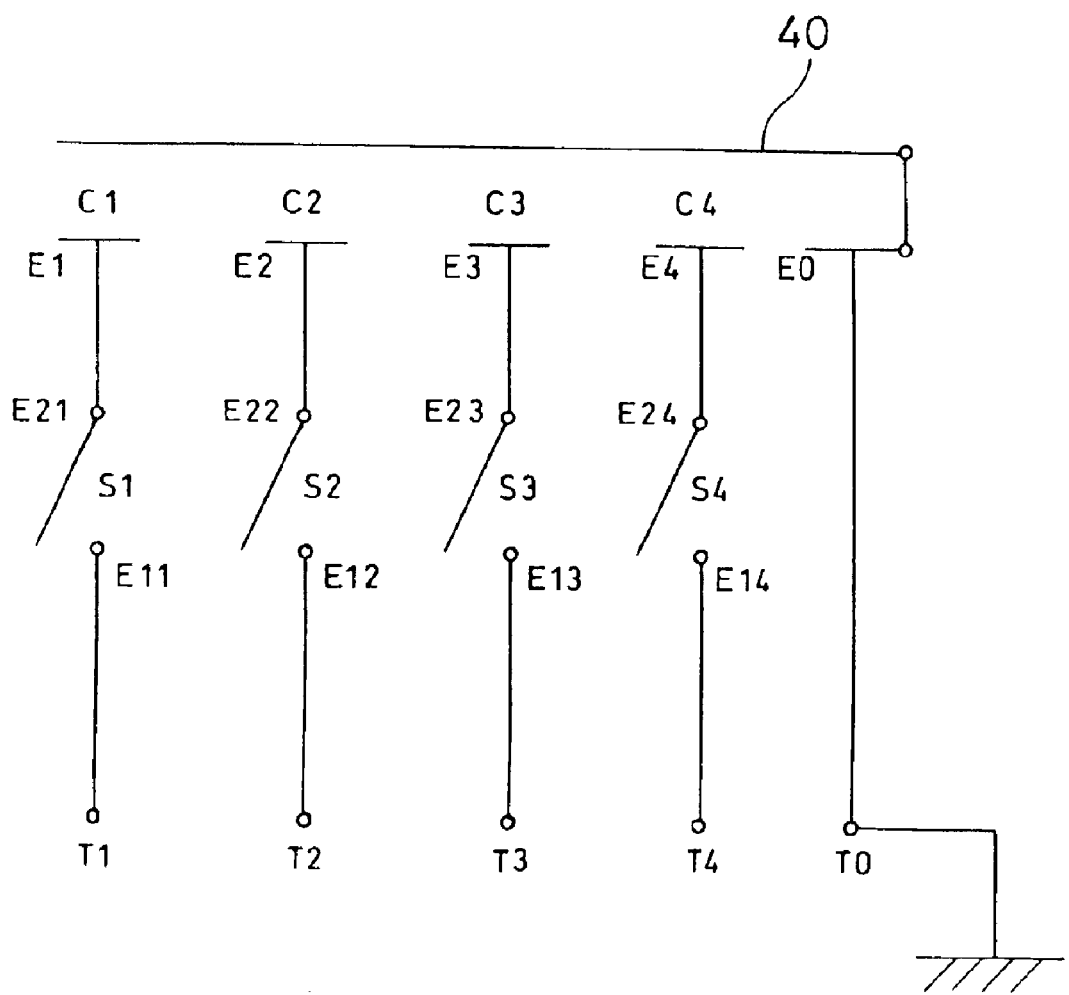
FIG. 4 is an equivalent circuit diagram for the construction of the capacitance type sensor shown in FIG. 1.
Figure 5:
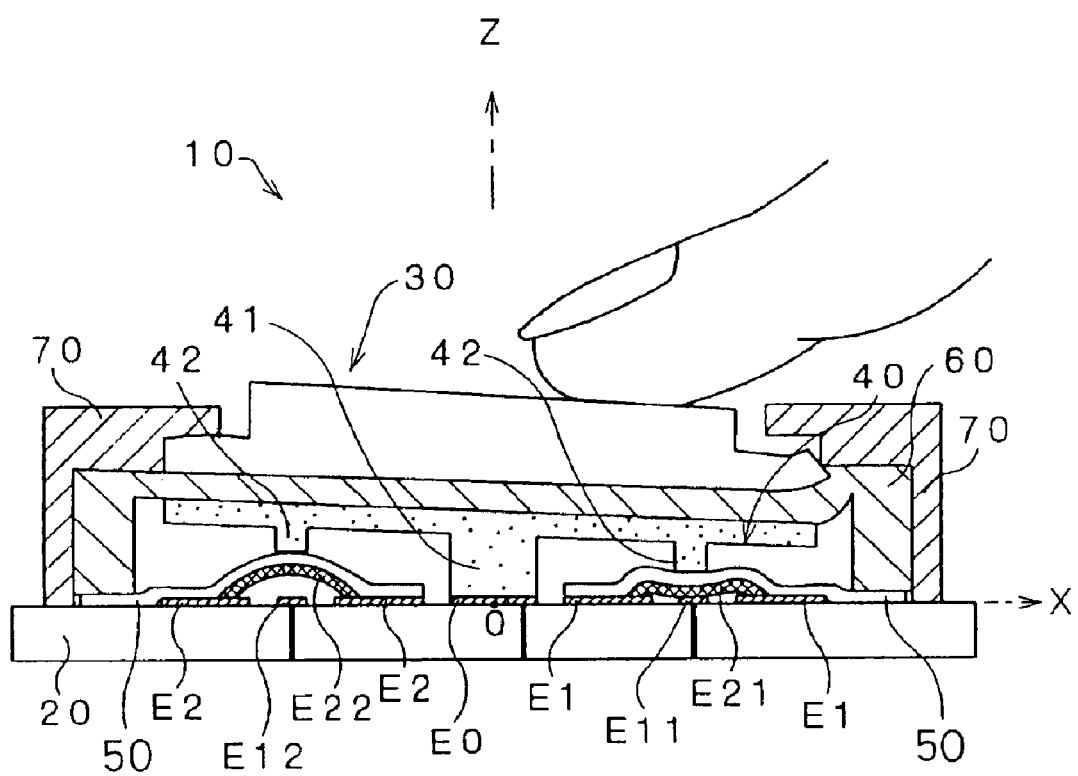
FIG. 5 is a schematic cross-sectional side view of the capacitance type sensor shown in FIG. 1 when the detective member is operated in an X-axis positive direction.
Figure 6:
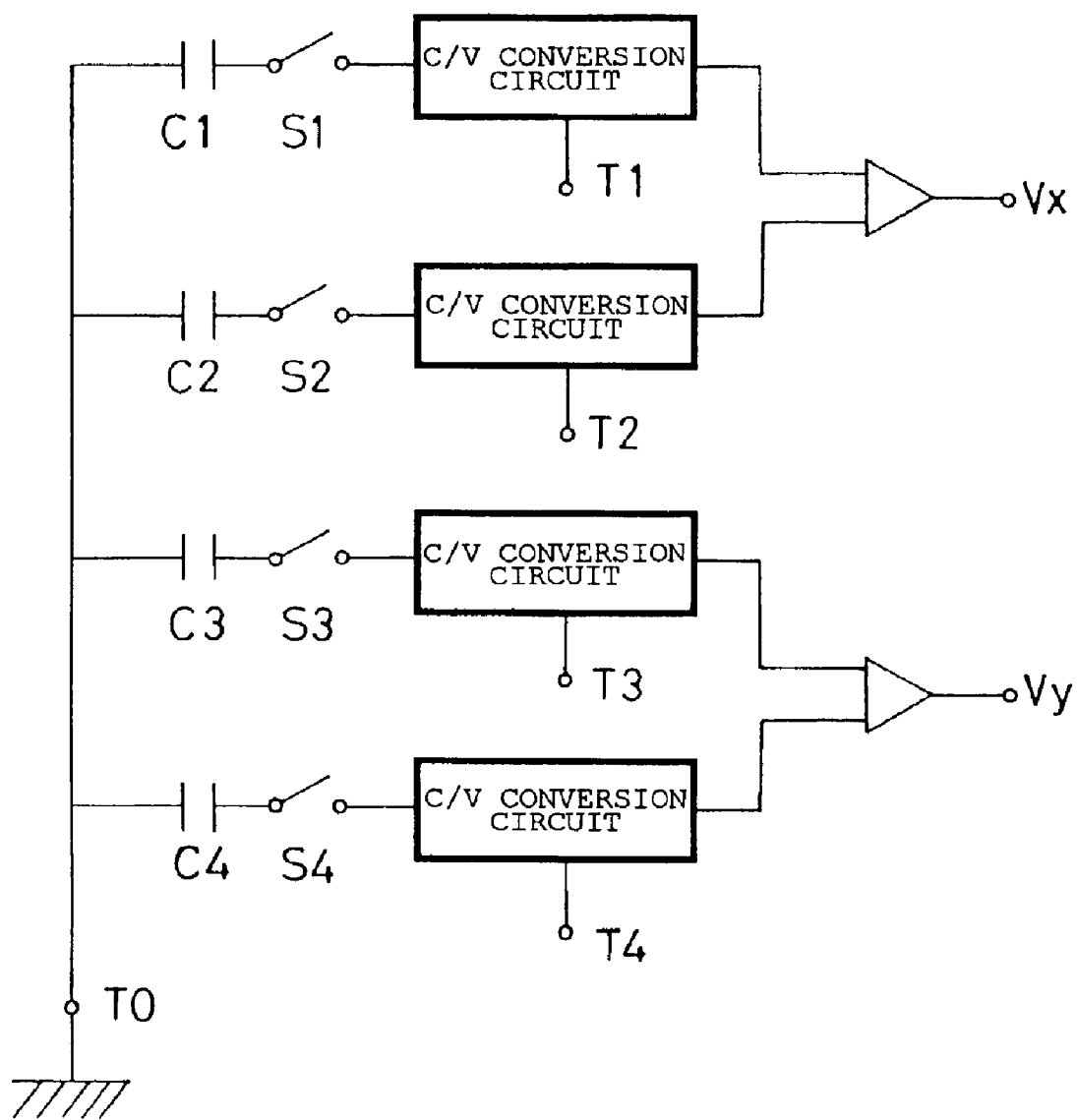
FIG. 6 is an illustration for explaining the way of deriving an output signal from a cyclic signal input to the capacitance type sensor shown in FIG. 1.

Now, operation of the capacitance type sensor 10 thus constructed according to this embodiment will be described with reference to the drawings. FIG. 4 is an equivalent circuit diagram for the construction of the capacitance type sensor shown in FIG. 1. FIG. 5 is a schematic cross-sectional side view of the capacitance type sensor shown in FIG. 1 when the detective member is operated in an X-axis positive direction. FIG. 6 is an illustration for explaining the way of deriving an output signal from a cyclic signal input to the capacitance type sensor shown in FIG. 1.

First, reference is made to the circuitry equivalent of the construction of the capacitance type sensor 10 with reference to FIG. 4. The capacitance element electrodes E1–E4 formed on the substrate 20 are opposite to the displacement electrode 40. The movable switch electrodes E21–E24 connected to the capacitance element electrodes E1–E4 have the function as switches S1–S4 that can selectively allow the connection between the terminals T1–T4 and the capacitance element electrodes E1–E4 by selecting its contact position with the fixed switch electrodes E11–E14 or the non-contact position therewith.

When the movable switch electrodes E21–E24 are not in contact with the fixed switch electrodes E11–E14 (OFF-state), the areas of the fixed switch electrodes E11–E14 are very small, as compared with the areas of the capacitance element electrodes E1–E4, or the movable switch electrodes E21–E24 serve as a kind of electrostatic shielding and, as a result, almost no capacitance is generated between the movable switch electrodes E21–E24 and the fixed switch electrodes E11–E14.

On the other hand, when the movable switch electrodes E21–E24 are in contact with the fixed switch electrodes E11–E14 (ON-state), the capacitance element electrodes E1–E4 are connected with the fixed switch electrodes E11–E14 and are made to be opposite to the displacement electrode 40, so that the capacitance elements C1–C4 are formed between the displaceable displacement electrode 40 that is the common electrode and the individual fixed capacitance element electrodes E1–E4. It can be said that the capacitance elements C1–C4 are variable capacitance elements that are each constructed to vary in capacitance value caused by displacement of the displacement electrode 40.

The respective capacitance values of the capacitance elements C1–C4 can be separately measured as the capacitance values generated between the displacement electrode 40 and the terminals T1–T4 connected to their respective capacitance element electrodes E1–E4. It is to be noted here that since the reference electrode E0 is connected to ground through the terminal T0, the displacement electrode 40 that is the common electrode for the capacitance elements C1–C4 is considered to be grounded.

Then, let us consider the case where the detective member 30 is operated in the X-axis positive direction in the state in which no force is applied to the detective member 30 shown in FIG. 1, as shown in FIG. 5, in other words, the case where a force to press down the detective member 30 (a force acting in the Z-axis negative direction) is applied to the detective member 30 from the arrow for the X-axis positive direction formed on the upper portion 31 of the detective member 30.

By pressing down a portion of the detective member 30 corresponding to the X-axis positive direction, the protrusion 42 corresponding to the X-axis positive direction formed on the displacement electrode 40 is displaced downwardly. Then, a downward force is applied from the protrusion 42 to the center portion of the movable switch electrode E21 through the insulating film 50. When the force does not reach a specified value, the movable switch electrode E21 is not displaced virtually. On the other hand, when the force reaches the specified value, the movable switch electrode E21 is elastically deformed and depressed drastically with buckling at the nearly top portion thereof and is brought into contact with the fixed switch electrode E11. This brings the switch S1 into the ON-state. At this time, the operator is given a pronounced click feeling. Thereafter, when the detective member 30 is displaced further, the displacement electrode 40 is deformed further, while the switch S1 is kept in the on-state. As a result, the space between the portion of the displacement electrode 40 corresponding to the X-axis positive direction and the capacitance element electrode E1 is varied.

Thus, as the distance between the electrodes forming the capacitance element C1 (between the portion of the displacement electrode 40 corresponding to the X-axis positive direction and the capacitance element electrode E1) is varied, the capacitance value of the capacitance element C1 is varied. In general, the capacitance value of the capacitance element is in inverse proportion to the distance between the electrodes forming the capacitance element. Accordingly, the capacitance value of the capacitance element C1 increases inversely as the distance between the electrodes forming the capacitance element C1.

At this time, the portion of the displacement electrode 40 corresponding to the X-axis negative direction is not displaced virtually. The portions of the displacement electrode 40 corresponding to the Y-axis positive direction and to the Y-axis negative direction are not displaced virtually, either. In practice, the corresponding portions of the displacement electrode 40 to the X-axis negative direction, the Y-axis positive direction, and the Y-axis negative direction may be slightly displaced downwardly, depending on the manner in which the force is applied to the detective member 30. But, unless the respective portions of the displacement electrode 40 are displaced until the movable switch electrodes E22–E24 corresponding to the respective directions are brought into contact with their respective fixed switch electrode E12–E14, the switches S2–S4 are kept in the OFF-state. Therefore, almost no capacitance is generated between the movable switch electrodes E12–E14 and their respective fixed switch electrode E22–E24 and, accordingly, such possible displacements have no impact on the output.

As seen from the above, when the detective member 30 is operated in the X-axis positive direction, only the C1 of the capacitance elements C1–C4 varies in capacitance value, because variation in the distance between the capacitance element electrode E1–E4 and the displacement electrode 40 is caused in the capacitance element C1, while the switches S1–S4 are kept in the ON-state.

Next, reference is made to the way of deriving an output signal showing magnitude and direction of a force applied from outside to the detective member 30 from variations of the capacitance values of the capacitance elements C1–C4 when the movable switch electrodes E21–E24 and the fixed switch electrodes E11–E14 are in contact with each other (the switches S1–S4 are in the ON-state), with reference to FIG. 6. It is to be noted that the output signals Vx, Vy indicate the magnitude and direction of an X-axis direction component of the force applied from outside and the magnitude and direction of a Y-axis direction component of the force applied from outside, respectively.

In order to derive the output signals Vx, Vy, cyclic signals, such as clock signals, are input to the terminals T1, T2 all the time. When the detective member 30 is displaced by a force from outside in the state in which the cyclic signals are being input to the terminals T1–T4, the displacement electrode 40 is displaced in the Z-axis direction with the displacement of the detective member. When the force applied from the displacement electrode 40 to the movable switch electrodes E21–E24 reaches the specified value, a center part of the movable switch electrodes E21–E24 is elastically deformed with buckling and is brought into contact with the fixed switch electrodes E11–E14. This brings the switches S1–S4 into the ON-state. Thereafter, when the detective member 30 is displaced further, the displacement electrode 40 is deformed further, while the switches S1–S4 are kept in the ON-state. As a result, the distance between the electrodes of each the capacitance elements C1–C4 varies and thereby the capacitance value of each of the capacitance elements C1–C4 varies. Then, phase lags in the cyclic signals input to the terminals T1–T4 are produced. By using the phase lags produced in the cyclic signal, the output signals Vx, Vy can be obtained which show the displacement of the detective member 30, i.e., the magnitude and direction of the force applied to the detective member 30 from outside for the X-axis direction and the magnitude and direction of the force applied thereto from outside for the Y-axis direction, respectively.

In further detail, when the cyclic signals are input to the terminals T1–T4, the cyclic signal A is input to the terminals T1, T3, and a cyclic signal B of identical in periodicity with but different in phase from the cyclic signal A is input to the terminals T2, T4. When the capacitance values of the capacitance elements C1–C4 are varied by a force applied to the detective member 30 from outside at that time, phase lags different in amount from each other are produced in the cyclic signals A input to the terminals T1–T4 or in the cyclic signals B input to the terminals T1–T4.

Specifically, when a force applied from outside includes an X-axis positive direction component, the capacitance value of the capacitance element C1 varies to thereby produce the phase lag in the cyclic signal A input to the terminal T1. When the force applied from outside includes an X-axis negative direction component, the capacitance value of the capacitance element C2 varies to thereby produce the phase lag in the cyclic signal B input to the terminal T2 as well. The variations of the capacitance values of the capacitance elements C1, C2 correspond to the X-axis positive direction component of the force from outside and the X-axis negative direction component of the force from outside, respectively. The phase lag in the cyclic signal A input to the terminal T1 and the phase lag in the cyclic signal B input to the terminal T2 are read by an exclusive-OR gate, to derive the output signal Vx. A sign for variation of the output signal Vx indicates the direction (X-axis positive direction or X-axis negative direction) of a component of a force from outside, and an absolute value thereof indicates a magnitude of the X-axis direction component.

When the force applied from outside includes a Y-axis positive direction component, the capacitance value of the capacitance element C3 varies to thereby produce the phase lag in the cyclic signal A input to the terminal T3. When the force applied from outside includes a Y-axis negative direction component, the capacitance value of the capacitance element C4 varies to thereby produce the phase lag in the cyclic signal B input to the terminal T4. The variations of the capacitance values of the capacitance elements C3, C4 correspond to the Y-axis positive direction component of the force from outside and the Y-axis negative direction component of the force from outside, respectively. The phase lag in the cyclic signal A input to the terminal T3 and the phase lag in the cyclic signal B input to the terminal T4 are read by the exclusive-OR gate to derive the output signal Vy. A sign for variation of the output signal Vy indicates the direction (Y-axis positive direction or Y-axis negative direction) of a component of a force from outside, and an absolute value thereof indicates a magnitude of the Y-axis direction component.

When a force applied from outside includes the X-axis direction component or the Y-axis direction component, the force may include both of the X-axis positive direction and the X-axis negative direction or both of the Y-axis positive direction and the Y-axis negative direction. Now, let us consider the X-axis direction component, for example. The value of the output signal Vx for the force including the X-axis positive direction component and the X-axis negative direction component which are identical in magnitude with each other is substantially the same as the value of the output signal Vx for the force applied from outside that does not include any X-axis direction component (the details will be mentioned later). On the other hand, when the X-axis positive direction component and the X-axis negative direction component are different from each other, the phase lag in the cyclic signal A input to the terminal T3 and the phase lag in the cyclic signal B input to the terminal T4 are different from each other. The output signal Vx is derived by reading the phase lags by the exclusive-OR gate in the same manner as in the above. The same applies to the output signal Vy for the Y-axis direction component.

Figure 7:
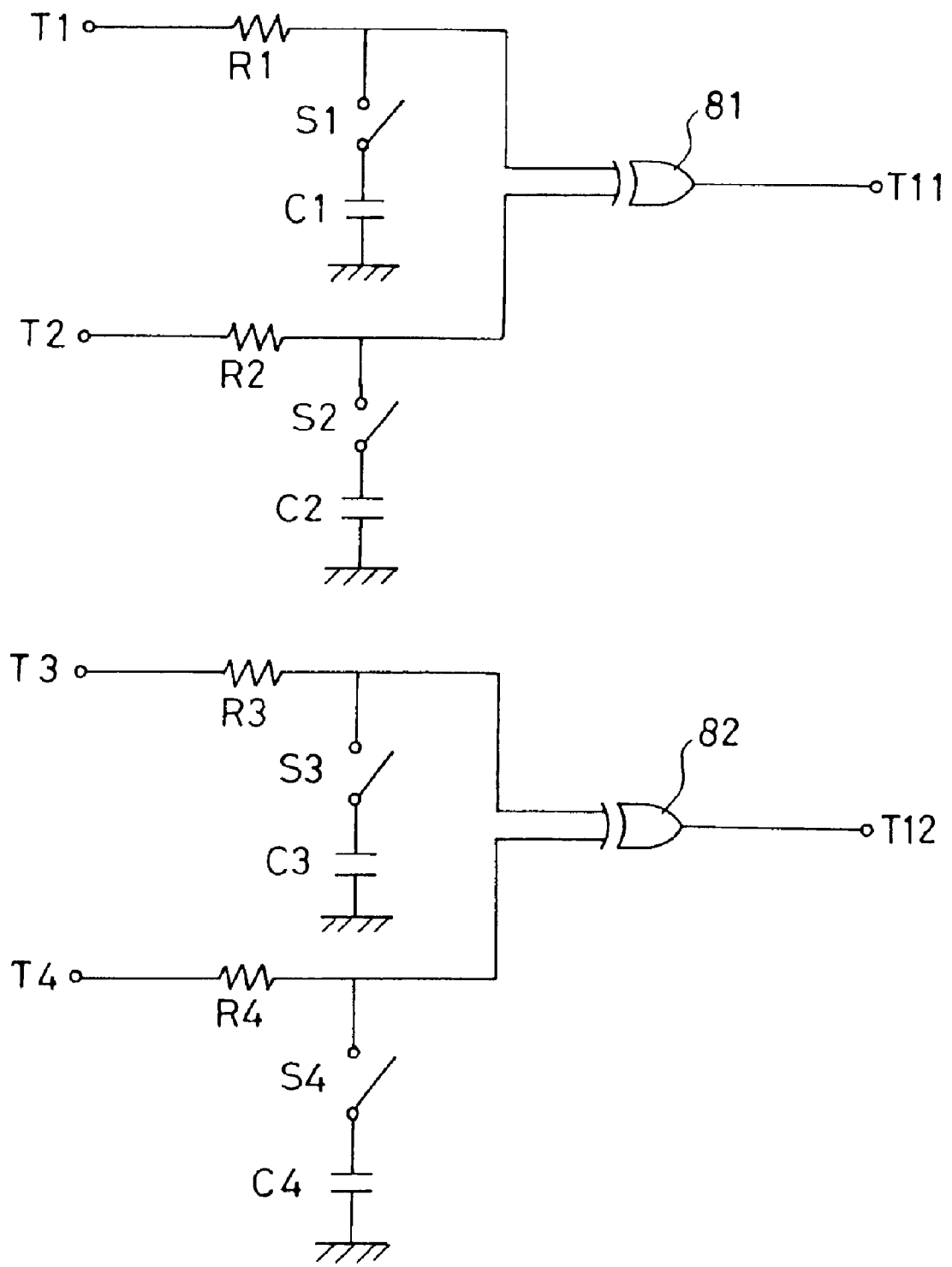
FIG. 7 is a circuit diagram showing a signal processing circuit of the capacitance type sensor shown in FIG. 1.

Next, reference is made to a signal processing circuit for deriving the output signals Vx, Vy by using the cyclic signals A, B input to the terminals T1, T2, with reference to the drawings. FIG. 7 is a circuit diagram showing a signal processing circuit of the capacitance type sensor shown in FIG. 1.

In the signal processing circuit shown in FIG. 7, cyclic signals of predetermined frequency are input to the terminals T1–T4 from an alternate signal oscillator (not shown). Resistance elements R1–R4 are connected to the terminals T1–T4, respectively. An EX-OR element 81 which is a logic element of the exclusive-OR gate is connected to output ends of the resistance elements R1, R2, and an EX-OR element 82 is connected to output ends of the resistance elements R3, R4. The output ends are connected to their respective terminals T11, T12. Further, the output ends of the resistance elements R1–R4 are respectively connected to input ends of the switches S1–S4 formed by the fixed switch electrodes E11–E14 and movable switch electrodes E21–E24. The output ends of the switches S1–S4 are connected to the capacitance elements C1–C4 formed between the capacitance element electrodes E1–E4 and the displacement electrode 40. The displacement electrode 40, which is one electrode of each of the capacitance elements C1–C4, is connected to ground, as mentioned above.

Figure 8:
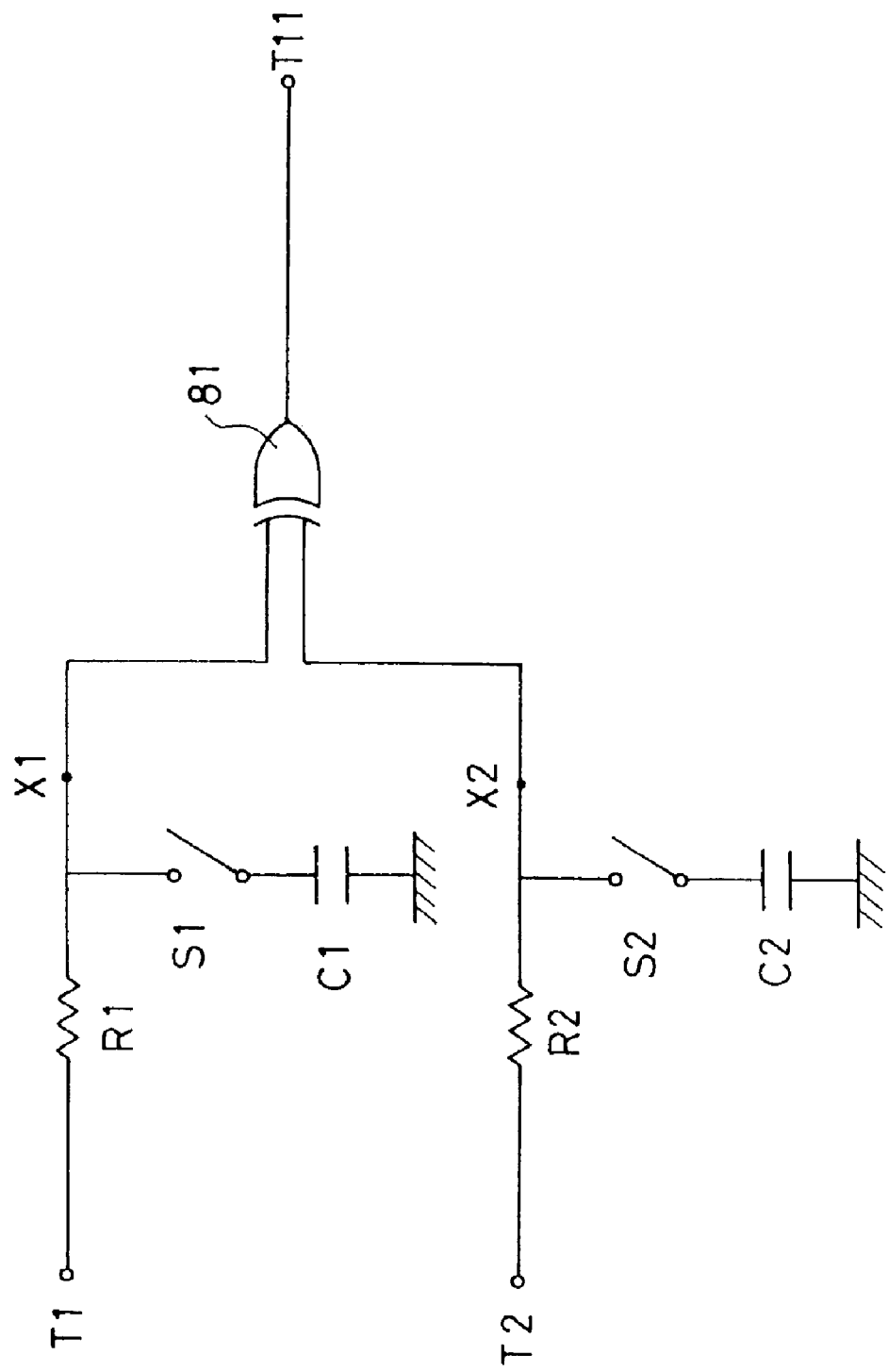
FIG. 8 is a circuit diagram showing a signal processing circuit for the X-axis direction components of the capacitance type sensor shown in FIG. 1.

Reference is made herefrom to the way of deriving the output signal Vx of the X-axis direction component, with reference to FIG. 8. As the way of deriving the output signal Vy of the Y-axis direction component is the same as the way of deriving the output signal Vx of the X-axis direction component, the detailed explanation thereof is omitted. FIG. 8 is a circuit diagram (a part of FIG. 7) showing a signal processing circuit for the X-axis direction component of the capacitance type sensor shown in FIG. 1. In this signal processing circuit, the capacitance element C1 and the resistance element R1, and the capacitance element C2 and the resistance element R2 form CR delay circuits, respectively. Accordingly, the cyclic signals (rectangular-wave signal) input to the terminals T1, T2 are delayed to a specific extent by the respective CR delay circuits and then are joined together in the EX-OR element 81.

If signals having sufficient driving capability cannot be fed to the terminals T1, T2, then inverter elements should preferably be inserted in between the terminal T1 and the resistance element R1 and between the terminal T2 and the resistance element R2, respectively. While the inverter elements are used to generate sufficient electric driving power for driving the CR delay circuits, they are unnecessary elements in a logical sense. When the same elements are used as the inverter element, signals from different routes can be compared in the same condition.

Figure 9:
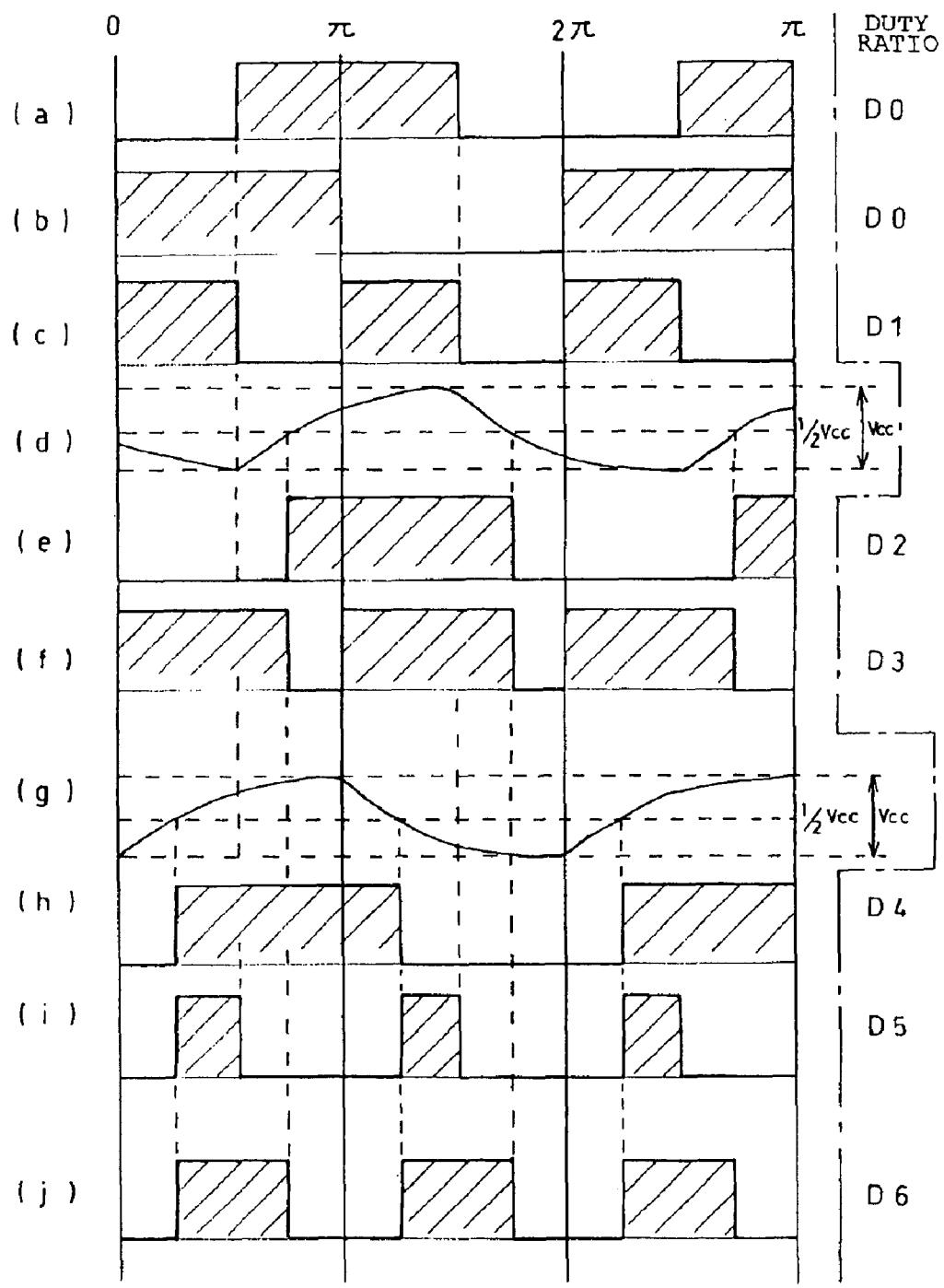
FIG. 9 is a view showing a waveform of a cyclic signal at each terminal and each node of the signal processing circuit shown in FIG. 8.

Then, operation of the circuit of FIG. 8 will be described with reference to FIG. 9. FIG. 9 is a view showing a waveform of a cyclic signal at each terminal and each node of the signal processing circuit shown in FIG. 8.

In the signal processing circuit of FIG. 8, the cyclic signals input to the terminals T1, T2 pass through the CR delay circuit and then input to the respective EX-OR elements 81 with predetermined delays of time. In more detail, a cyclic signal f ($\phi$) (which corresponds to the cyclic signal A noted above (hereinafter it is referred to as "cyclic signal A")) is input to the terminal T1, and a cyclic signal f ($\phi+\theta$) (which corresponds to the cyclic signal B noted above (hereinafter it is referred to as "cyclic signal "B")) identical in periodicity with but different in phase from the cyclic signal f ($\phi$) by $\theta$ only is input to the terminal T2. Reference is made herein to the case where a duty ratio of the cyclic signal A is 50% and the phase of the cyclic signal B is more advanced than that of the cyclic signal A by ¼ of cycle of the cyclic signal A only.

The cyclic signal A and the cyclic signal B which are different in phase from each other and are input to the terminals T1 and T2 respectively are generated in such a way that the cyclic signals output from a single alternate signal oscillator are divided two routes and the cyclic signals passing through a CR delay circuit (not shown) arranged in one of the two routes are delayed in phase. The way of delaying the phase of the cyclic signals is not limited to the way using the CR delay circuit. Any other adequate ways may be used. The cyclic signal A and the cyclic signal B which are different in phase from each other may be generated by using two alternate signal oscillators and then input to the terminals T1 and T2, respectively.

Reference marks (a) and (b) of FIG. 9 indicate waveforms of the cyclic signals A and B input to the terminals T1 and T2, respectively. When no force is applied to the detective member 30 from outside (when no operation is given to the detective member), the switches S1 and S2 of the signal processing circuit of FIG. 8 are in the OFF-state and the electric charges stored in the capacitance elements C1 and C2 are so negligible that the cyclic signal A and the cyclic signal B are input to the EX-OR element 81 without substantial delay. Accordingly, the signals having the same waveform as the cyclic signals at the terminals T1, T2 are input to the EX-OR element 81, for an exclusive-OR logical operation between those signals and then the result is output to the terminal T11. It should be noted that the output signal Vx output to the terminal T11 is a rectangular-wave signal having a duty ratio D1, as shown in FIG. 9(c).

Then, when the detective member 30 is operated in the X-axis positive direction (See FIG. 5), the switch S1 is put in the ON-state, so that the capacitance element C1 is connected to the resistance element R1 to form the delay circuit. The cyclic signal A input to the terminal T1 passes through the delay circuit formed by the capacitance element C1 and the resistance element R1 and reaches the node X1 with a delay of time. FIG. 9(d) shows an electrical change at the node X1 of the signal processing circuit shown in FIG. 8 when the cyclic signal A is input to the terminal T1.

In the case where the cyclic signal cyclically repeating "Hi" signal and "Lo" signal is input to the terminal T1, the electrical change occurs repeatedly, as shown in FIG. 9(d). That is to say, when the input of the "Hi" signal is commenced, the electric charge is gradually stored in the capacitance element C1 forming the CR delay circuit, so that the electric potential in the node X1 is gradually increased, while on the other hand, when the input of the "Lo" signal is commenced, the electric charge in the capacitance element C1 forming the CR delay circuit is gradually discharged, so that the electric potential in the node X1 is gradually decreased. This electrical change occurs repeatedly, as shown in FIG. 9(d).

In practice, the waveform of the potential in the node X1 is converted to a rectangular wave (pulse form) via a comparator (not shown) having a specified threshold. The rectangular wave is formed by the comparator outputting the "Hi" signal when the potential is larger than the preset threshold and outputting the "Lo" signal when the potential is smaller than the preset threshold. In the case where the EX-OR element 81 is a C-MOS logic device, the threshold voltage is preferably set at approximately Vcc/2, where Vcc is a power-supply voltage of the comparator. Thus, the waveform of the potential in the node X1 is converted to a rectangular wave having a duty ratio D2 through the comparator, as shown in FIG. 9(e).

At this time, the switch S2 is in the OFF-state, so the capacitance element C2 and the resistance element R2 do not form the delay circuit. Due to this, the cyclic signal reaching the node X2 has the same waveform as the cyclic signal B (the signal having a waveform shown in FIG. 9(b)).

Thus, the signals having the same waveform as the cyclic signals at the nodes X1, X2 (the signals having the waveform shown in FIGS. 9(b) and 9(e)) are input to the EX-OR element 81, for an exclusive-OR logical operation between those signals and then the result is output to the terminal T11. It should be noted that the signal Vx output to the terminal T11 is a rectangular-wave signal having a duty ratio D3 as shown in FIG. 9(f).

When the portion of the detective member 30 corresponding to the X-axis positive direction is pressed down further, the distance between the displacement electrode 40 and the capacitance element electrode E1 is reduced, so that the capacitance value of the capacitance element C1 is increased along with it. At this time, the phase lag (quantity of delay) caused when the cyclic signal A passed through the delay circuit is increased, so that the duty ratio D3 of the output signal Vx output to the terminal T11 is also increased.

When the detective member 30 is operated in the X-axis negative direction, the switch S2 is put into the ON-state, so that the capacitance element C2 is connected to the resistance element R2 to form the delay circuit. The cyclic signal B input to the terminal T2 passes through the delay circuit formed by the capacitance element C2 and the resistance element R2 and reaches the node X2 with a delay of time. FIG. 9(g) shows an electrical change at the node X2 of the signal processing circuit shown in FIG. 8 when the cyclic signal B is input to the terminal T2.

In the case where the cyclic signal cyclically repeating "Hi" signal and "Lo" signal is input to the terminal T2, the electrical change occurs repeatedly, as shown in FIG. 9(g). That is to say, when the input of the "Hi" signal is commenced, the electric charge is gradually stored in the capacitance element C2 forming the CR delay circuit, so that the electric potential in the node X2 is gradually increased, while on the other hand, when the input of the "Lo" signal is commenced, the electric charge in the capacitance element C2 forming the CR delay circuit is gradually discharged, so that the electric potential in the node X2 is gradually decreased. This electrical change occurs repeatedly, as shown in FIG. 9(g).

In practice, the waveform of the potential in the node X2 is converted to a rectangular wave (pulse form) via a comparator (not shown) having a specified threshold. The rectangular wave is formed by the comparator outputting the "Hi" signal when the potential is larger than the preset threshold and outputting the "Lo" signal when the potential is smaller than the preset threshold. In the case where the EX-OR element 81 is a C-MOS logic device, the threshold voltage is preferably set at approximately Vcc/2, where Vcc is a power-supply voltage of the comparator. Thus, the waveform of the potential in the node X2 is converted to a rectangular wave having a duty ratio D4 through the comparator, as shown in FIG. 9(h).

At this time, the switch S1 is in the OFF-state, so the capacitance element C1 and the resistance element R1 do not form the delay circuit. Due to this, the cyclic signal reaching the node X1 has the same waveform as the cyclic signal A (the signal having a waveform shown in FIG. 9(a)).

Thus, the signals having the same waveform as the cyclic signals in the nodes X1, X2 (the signals having the waveform shown in FIGS. 9(a) and 9(h)) are input to the EX-OR element 81, for an exclusive-OR logical operation between those signals and then the result is output to the terminal T11. It should be noted that the signal Vx output to the terminal T11 is a rectangular-wave signal having a duty ratio D5 as shown in FIG. 9(i).

When the portion of the detective member 30 corresponding to the X-axis negative direction is pressed down further, the distance between the displacement electrode 40 and the capacitance element electrode E2 is reduced, so that the capacitance value of the capacitance element C2 is increased along with it. At this time, the phase lag (quantity of delay) caused when the cyclic signal B passed through the delay circuit is increased, so that the duty ratio D3 of the output signal Vx output to the terminal T11 is decreased.

Thus, the duty ratio D5 (FIG. 9(i)) of the output signal Vx output to the terminal T11 when the detective member 30 is operated in the X-axis negative direction only is smaller than the duty ratio D2 (FIG. 9(e)) of the output signal Vx output to the terminal T11 when the detective member 30 is operated in the X-axis positive direction only.

When the operation for the X-axis positive direction and the operation for the X-axis negative direction are simultaneously given to the detective member 30, the cyclic signal A and the cyclic signal B input to the terminals T1 and T2 pass through the delay circuit formed by the capacitance element C1 and the resistance element R1 and the delay circuit formed by the capacitance element C2 and the resistance element R2, respectively, and reach the nodes X1 and X2. Accordingly, the electrical changes in the nodes X1 and X2 are as shown in FIGS. 9(d) and 9(g).

Thus, the digitized signals obtained by converting the electrical changes in the nodes X1 and X2 (the waveforms shown in FIGS. 9(d) and (g)) into digital form by the specified threshold are input to the EX-OR element 81, for the exclusive-OR logical operation between those signals and then the result is output to the terminal T11. It should be noted that the signal Vx output to the terminal T11 is a rectangular-wave signal having a duty ratio D6 as shown in FIG. 9(j).

Thus, the duty ratio D6 (FIG. 9(j)) of the output signal Vx output to the terminal T11 when the operation for the X-axis positive direction and the operation for the X-axis negative direction are simultaneously given to the detective member 30 is substantially the same as the duty ratio D1 (FIG. 9(c)) of the output signal Vx output to the terminal T11 when no operation is given to the detective member 30. However, both signals are out of phase with each other.

Figure 10:
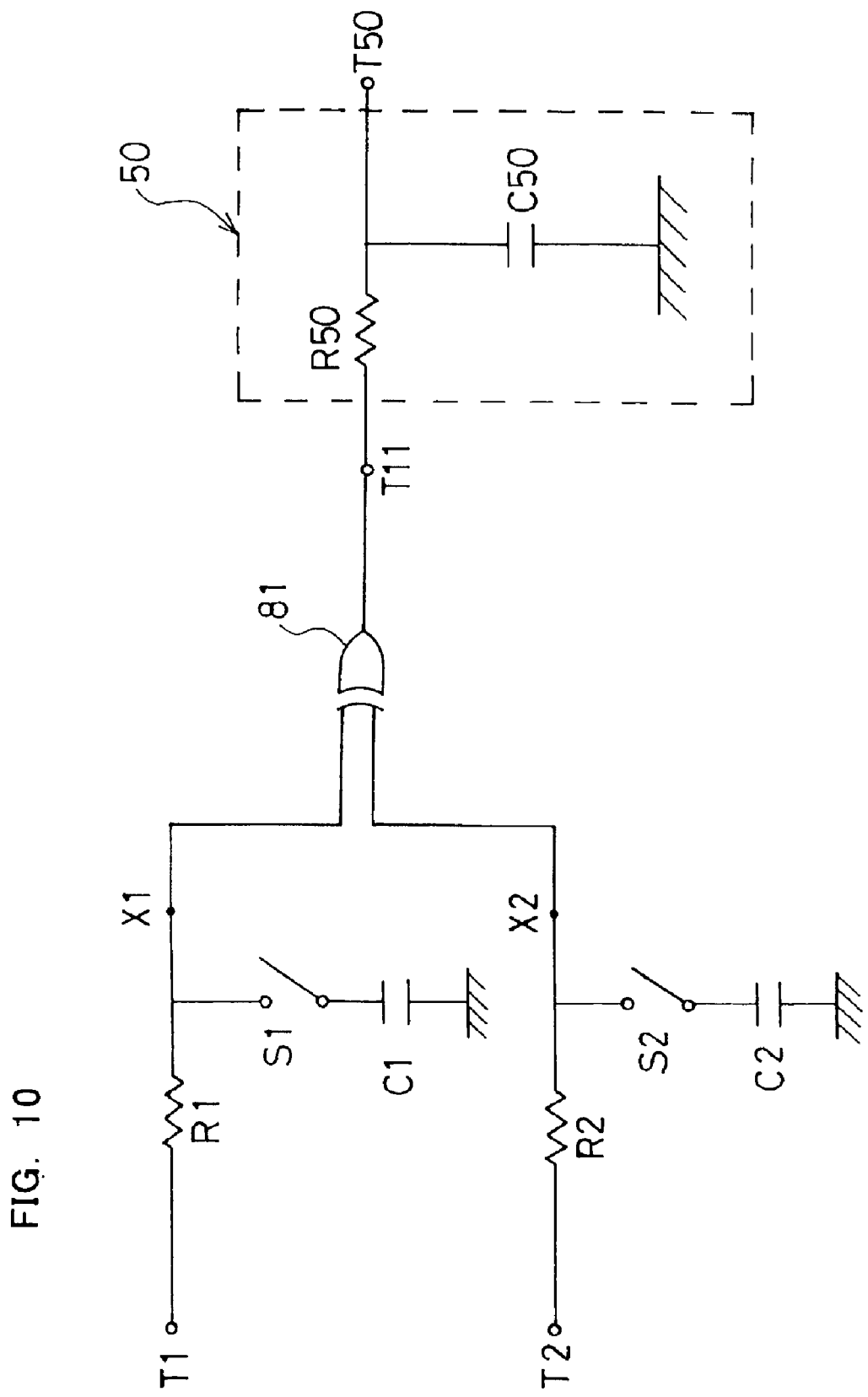
FIG. 10 is a circuit diagram showing a signal processing circuit including a circuit for converting output signal for the X-axis direction components of the capacitance type sensor shown in FIG. 1 into analog voltage.

The output signal Vx output to the terminal T11 can be used by converting it into analog voltage Vx'. FIG. 10 is a circuit diagram showing a signal processing circuit including a circuit for converting output signal for the X-axis direction components of the capacitance type sensor shown in FIG. 1 into analog voltage.

As shown in FIG. 10, the output signals Vx output to the terminal T11 is smoothened when passing through a low-pass filter 50 and then the smoothed output signals Vx are output as the analog voltage Vx' to a terminal T50. The value of the analog voltage Vx' varies in proportion to the duty ratio of the output signal Vx. Therefore, with an increase in the duty ratio of the output signal Vx, the value of the analog voltage Vx' increases. On the other hand, with a decrease in the duty ratio of the output signal Vx, the value of the analog voltage Vx' decreases. When the duty ratio of the output signal Vx does not vary virtually, the value of the analog voltage Vx' does not vary virtually, either.

As mentioned above, according to the capacitance type sensor 10 of this embodiment, when an operator operates the detective member 30, the movable switch electrodes E21–E24 corresponding to the operating directions are elastically deformed with a click feeling and also the sensor 10 does not recognize the displacement of the detective member 30 until the movable switch electrodes E21–E24 are contacted with the fixed switch electrodes E11–E14. Therefore, when the operator feels a click, he/she can easily comprehend from the click feeling that he/she is actually carrying out the operation. Also, since the sensor 10 does not recognize the displacement of the detective member 30 until an external force enough to make the operator feel a click is applied to the detective member 30, when the operator unintentionally or unconsciously applies to the detective member 30 an external force which is too small for the operator to feel a click, the sensor 10 does not recognize the displacement of the detective member 30. Therefore, a possible disturbance, such as a happening that the detective member 30 happen to contact with another member, is avoided, so that only the displacement of the detective member 30 caused by the operator's intentional operation is surely detected.

Also, the plurality of capacitance element electrodes E1–E4 are formed so that the X-axis direction components and the Y-axis direction components of a force applied to the detective member 30 from outside can be recognized separately. In addition, since signals with different phases are fed to the paired capacitance element electrodes (E1 and E2, and E3 and E4), the phase lag of the signal, when passing through the circuit, can be increased. Further, since the signal processing circuit using the logical element is used, the signal can be detected with high precision. The capacitance type sensor thus constructed is preferably used as an input device of a personal computer, a mobile phone, a game, and the like.

Figure 11:
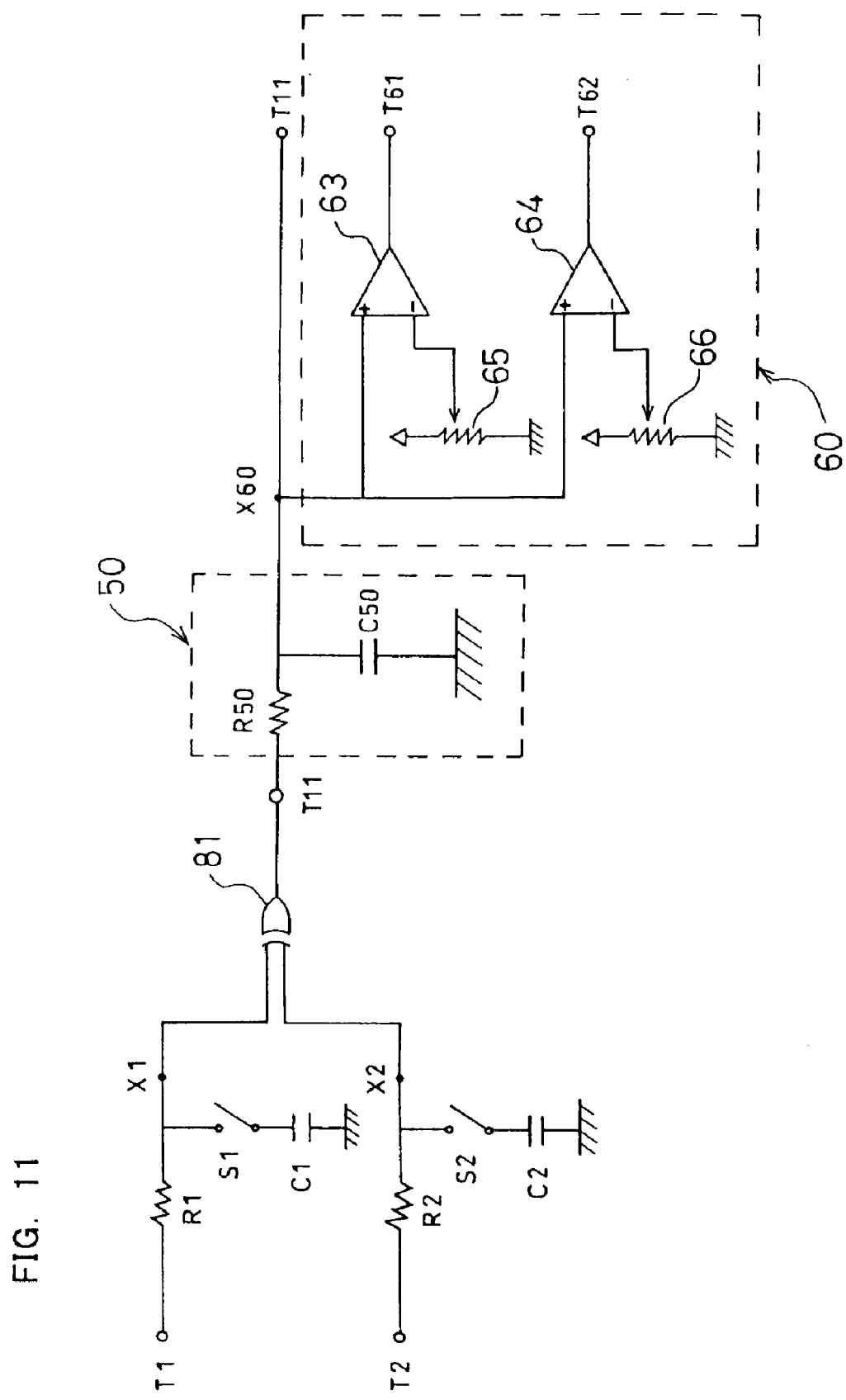
FIG. 11 is a circuit diagram showing a signal processing circuit for the X-axis direction components of a first variant of the capacitance type sensor shown in FIG. 1.
Figure 12:
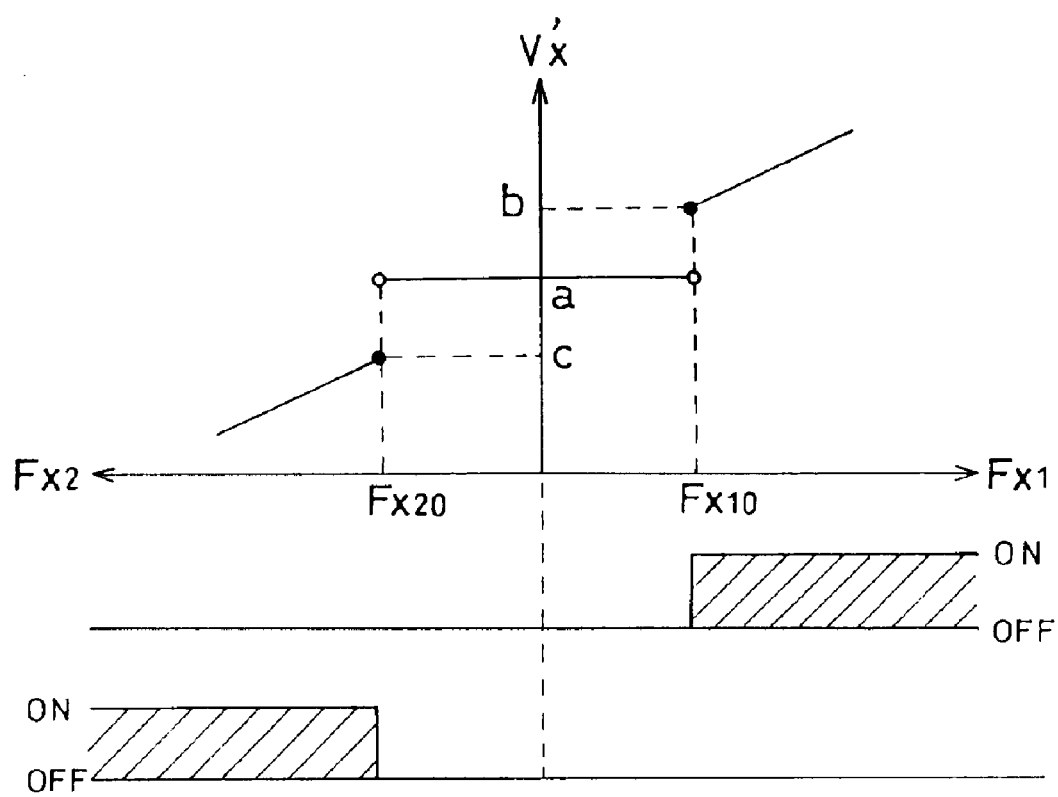
FIG. 12 is a view showing the relationship between the pressing force acting on the detective member and the analog voltage output.

Next, a first variant of the first embodiment of the present invention will be described with reference to the drawings. FIG. 11 is a circuit diagram showing a signal processing circuit for the X-axis direction components of the capacitance type sensor according to the first variant. FIG. 12 is a view showing the relationship between the pressing force acting on the detective member and the analog voltage output. The signal processing circuit of FIG. 11 differs from the signal processing circuit of the capacitance type sensor of FIG. 1 in that a circuit 60 is connected between the low-pass filter 50 of FIG. 10 and the terminal 11. As the remaining constructions are the same as those of the capacitance type sensor 1 of FIG. 1, the description thereon will be omitted, with like numerals given to like parts.

The circuit 60 has comparators 63, 64 and variable resisters 65, 66 and is connected to a node X60 between the low-pass filter 50 and the terminal 11. One input terminal of the comparator 63 is connected to the variable resister 65 and the other terminal of the comparator 63 is connected to the node X60. An output terminal of the comparator 63 is connected to a terminal 61. Similarly, one input terminal of the comparator 64 is connected to the variable resister 66, and the other input terminal of the comparator 64 is connected to the node X60. Also, the output terminal of the comparator 64 is connected to the terminal 62. A predetermined voltage is applied to the variable resisters 65, 66 via a power source (not shown), and values input to the comparators 63, 64 (hereinafter they are referred to as "comparative values") can be changed by changing the resistance values.

Now, the relationship between the pressing forces Fx1, Fx2 acting on the detective member 30 and the analog voltage Vx' output will be described with reference to FIG. 12. The pressing forces Fx1, Fx2 show the force acting on the detective member 30 in the X-axis position direction thereof and the force acting on the detective member 30 in the X-axis negative direction thereof, respectively. A value of the analog voltage Vx' found when neither the pressing force Fx1 nor the pressing force Fx2 is applied to the detective member is expressed by "a".

The value "a" of the analog voltage Vx' is kept unchanged until the pressing force Fx1 reaches a pressing force Fx10. When the pressing force Fx1 reaches the pressing force Fx10, the value of the analog voltage Vx' increases up to a voltage value "b" instantaneously. It should be noted that the pressing force Fx10 corresponds to a force (a predetermined value) required for a central portion of the movable switch electrode E21 to be displaced drastically with buckling as described in the first embodiment. Further, as the pressing force Fx1 increases, the value of the analog voltage Vx' increases in proportion to it.

Similarly, the value "a" of the analog voltage Vx' is kept unchanged until the pressing force Fx2 reaches a pressing force Fx20. When the pressing force Fx2 reaches the pressing force Fx20, the value of the analog voltage Vx' decreases down to a voltage value "c" instantaneously. It should be noted that the pressing force Fx20 corresponds to a force (a predetermined value) required for a central portion of the movable switch electrode E22 to be displaced drastically with buckling as described in the first embodiment. Further, as the pressing force Fx2 increases, the value of the analog voltage Vx' decreases in proportion to it.

Thus, when the comparative value of the comparator 63 is set between the voltage value "a" and the voltage value "b" by changing the resistance value of the variable resister 65, the signal showing either of the ON-state and the OFF-state can be output to the terminal 61. Specifically, the signal showing the OFF-state can be output until the pressing force Fx1 reaches the pressing force Fx10, and the signal showing the ON-state can be output when the pressing force Fx1 reaches the pressing force Fx10 (FIG. 12).

Similarly, when the comparative value of the comparator 64 is set between the voltage value "a" and the voltage value "b" by changing the resistance value of the variable resister 66, the signal showing either of the ON-state and the OFF-state can be output to the terminal 62. Specifically, the signal showing the OFF-state can be output until the pressing force Fx2 reaches the pressing force Fx20, and the signal showing the ON-state can be output when the pressing force Fx2 reaches the pressing force Fx20 (FIG. 12).

Thus, when the signal processing circuit including the circuit 60 is used, the capacitance type sensor 10 can be used as an analog voltage control unit having a switch function. In other words, the switches S1, S2 can be used to start recognizing the X-axis direction components of the force applied from outside and can alternatively be used to selectively switch between the ON-state and the OFF-state of other connected circuits or equipment.

The function of the circuit 60 can be performed by a microcomputer with an A/D conversion port using software like a program.

Figure 13:
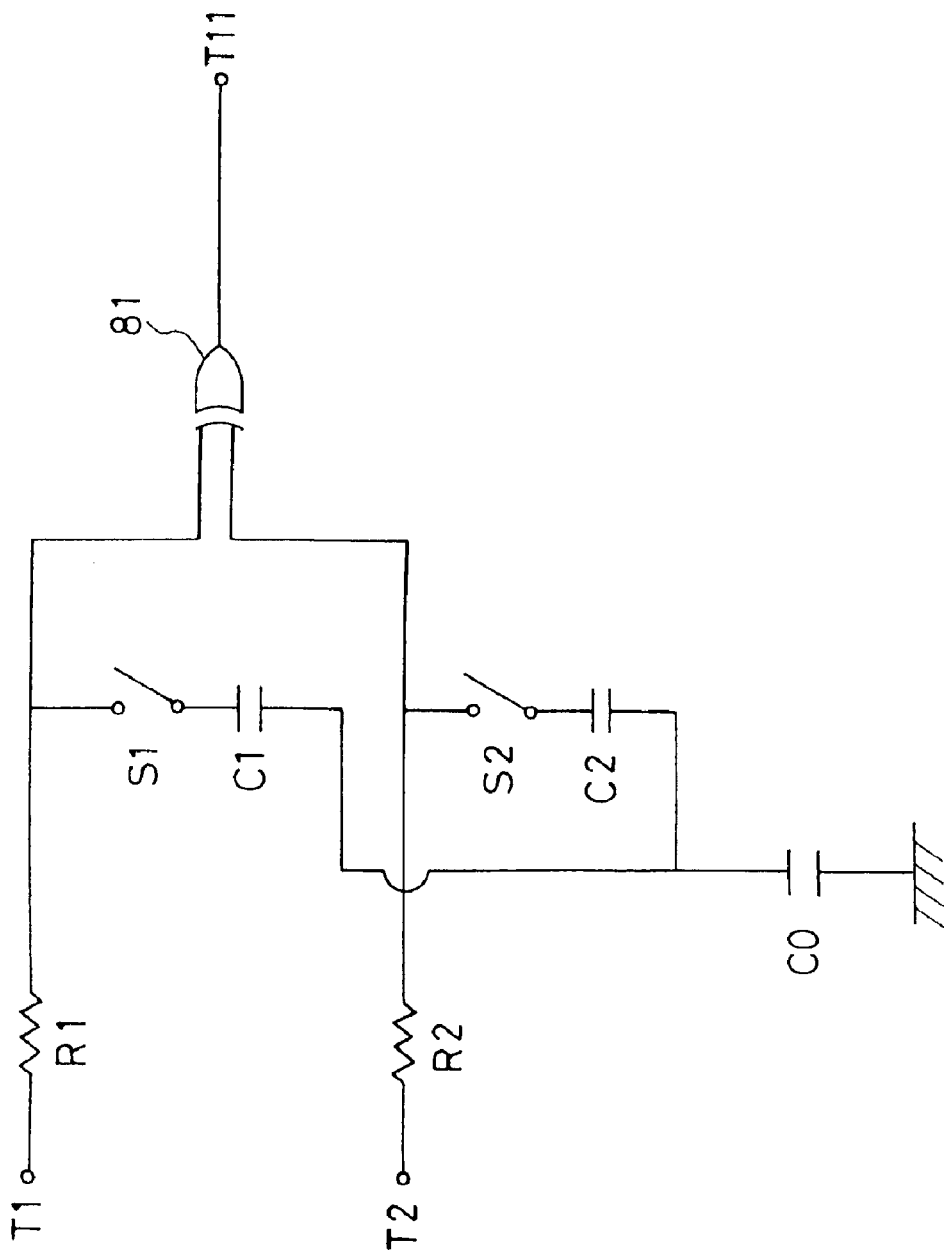
FIG. 13 is a circuit diagram showing a signal processing circuit for the X-axis direction components of a second variant of the capacitance type sensor shown in FIG. 1.

Next, a second variant of the first embodiment of the present invention will be described with reference to the drawing. FIG. 13 is a circuit diagram showing a signal processing circuit for the X-axis direction components of the capacitance type sensor according to the second variant. The signal processing circuit of FIG. 13 differs from the signal processing circuit of the capacitance type sensor of FIG. 1 in that a capacitance element C0 is formed between the displacement electrode 40 and the reference electrode E0. As the remaining constructions are the same as those of the capacitance type sensor 1 of FIG. 1, the description thereon will be omitted, with like numerals given to like parts.

The insulating film 50 is laid over the substrate 20 in such a relation that it is closely contacted with the capacitance element electrodes E1–E4, the movable switch electrodes E21–E24 and the reference electrode E0 and covers the substrate 20. Thus, the capacitance element C0 is formed between the displacement electrode 40 and the reference electrode E0 by arranging the insulating film 50 between the displacement electrode 40 and the reference electrode E0.

Accordingly, the displacement electrode 40 is electrically connected with the grounded reference electrode E0 via a capacitive coupling formed by the capacitive element C0 (which has the function of coupling condenser), not via a direct contact. This can provide an improved withstand voltage of the capacitance type sensor 10, thus practically eliminating the possibility that the sensor may be damaged by a spark current flowing through the sensor, and also can prevent a possible failure such as a bad connection. Therefore, the capacitance type sensor with improved reliability can be obtained. In addition, since the reference electrode E0 is prevented from being exposed to air, the related electrodes can be prevented from being oxidized.

Figure 14:
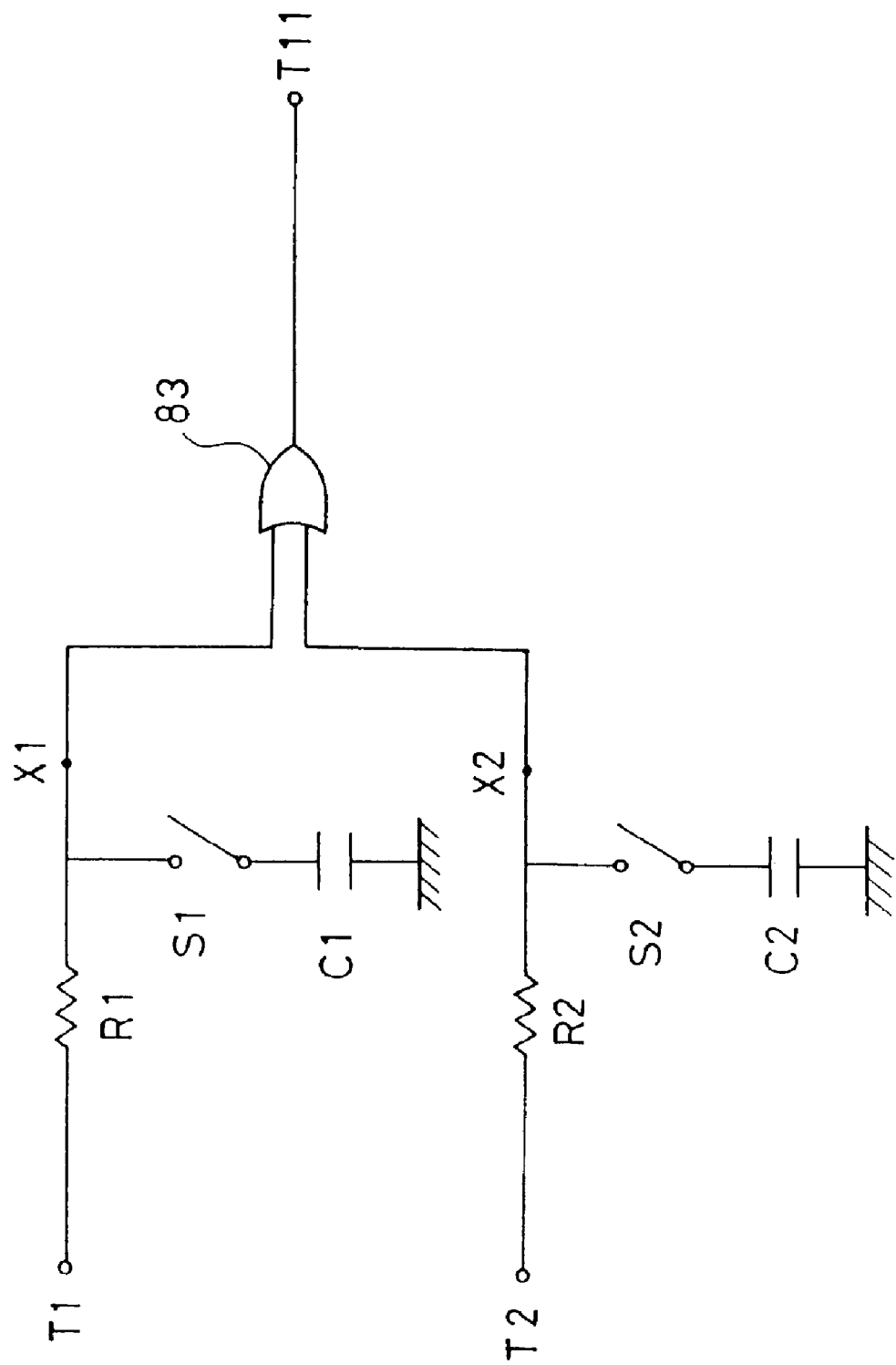
FIG. 14 is a circuit diagram showing a signal processing circuit for the X-axis direction components of a third variant of the capacitance type sensor shown in FIG. 1.

Next, a third variant of the first embodiment of the present invention will be described with reference to the drawing. FIG. 14 is a circuit diagram showing a signal processing circuit for the X-axis direction components of the capacitance type sensor according to the third variant. The signal processing circuit of FIG. 14 differs from the signal processing circuit of the capacitance type sensor of FIG. 1 in that in place of the EX-OR element, an OR element is used as the logical element. As the remaining constructions are the same as those of the capacitance type sensor 1 of FIG. 1, the description thereon will be omitted, with like numerals given to like parts.

In FIG. 14, when the portion of the detective member 30 corresponding to the X-axis positive direction is pressed down, the switch S1 is put in the ON-state. Then, when the portion of the detective member 30 corresponding to the X-axis positive direction is pressed down further, the cyclic signal A input to the terminal T1 passes through the CR delay circuit formed by the capacitance element C1 and the resistance element R1 and reaches the node X1. At this time, a predetermined delay is produced in the cyclic signal in the node X1, as shown in FIG. 9($e$). Similarly, when the portion of the detective member 30 corresponding to the X-axis negative direction is pressed down, the switch S2 is put in the ON-state. Then, when the portion of the detective member 30 corresponding to the X-axis negative direction is pressed down further, the cyclic signal B input to the terminal T2 passes through the CR delay circuit formed by the capacitance element C2 and the resistance element R2 and reaches the node X2. At this time, a predetermined delay is produced in the cyclic signal in the node X2, as shown in FIG. 9($h$).

Accordingly, the signals having the same waveform as the cyclic signals in the nodes X1, X2 are input to the OR element 83, for the logical operation OR between those signals and then the result is output to the terminal T11, as is the case with FIG. 8. It should be noted that the output signal output to the terminal T11 is a rectangular-wave signal having a specific duty ratio.

The duty ratio between the rectangular-wave signal output to the terminal 51 when the OR element 83 is used and the rectangular-wave signal output to the terminal 51 when the detective member 30 is not operated lessens in variation, as compared with that of the rectangular-wave signal output to the terminal 51 when the EX-OR element is used. This probably causes reduction in sensitivity of the capacitance type sensor.

Accordingly, when the components of the capacitance type sensor are made from material that can significantly modify the sensitivity of the sensor, the OR element is preferably used to adjust the sensitivity of the capacitance type sensor (reduce the sensitivity in this variant) by the circuitry of the signal processing circuit.

Figure 15:
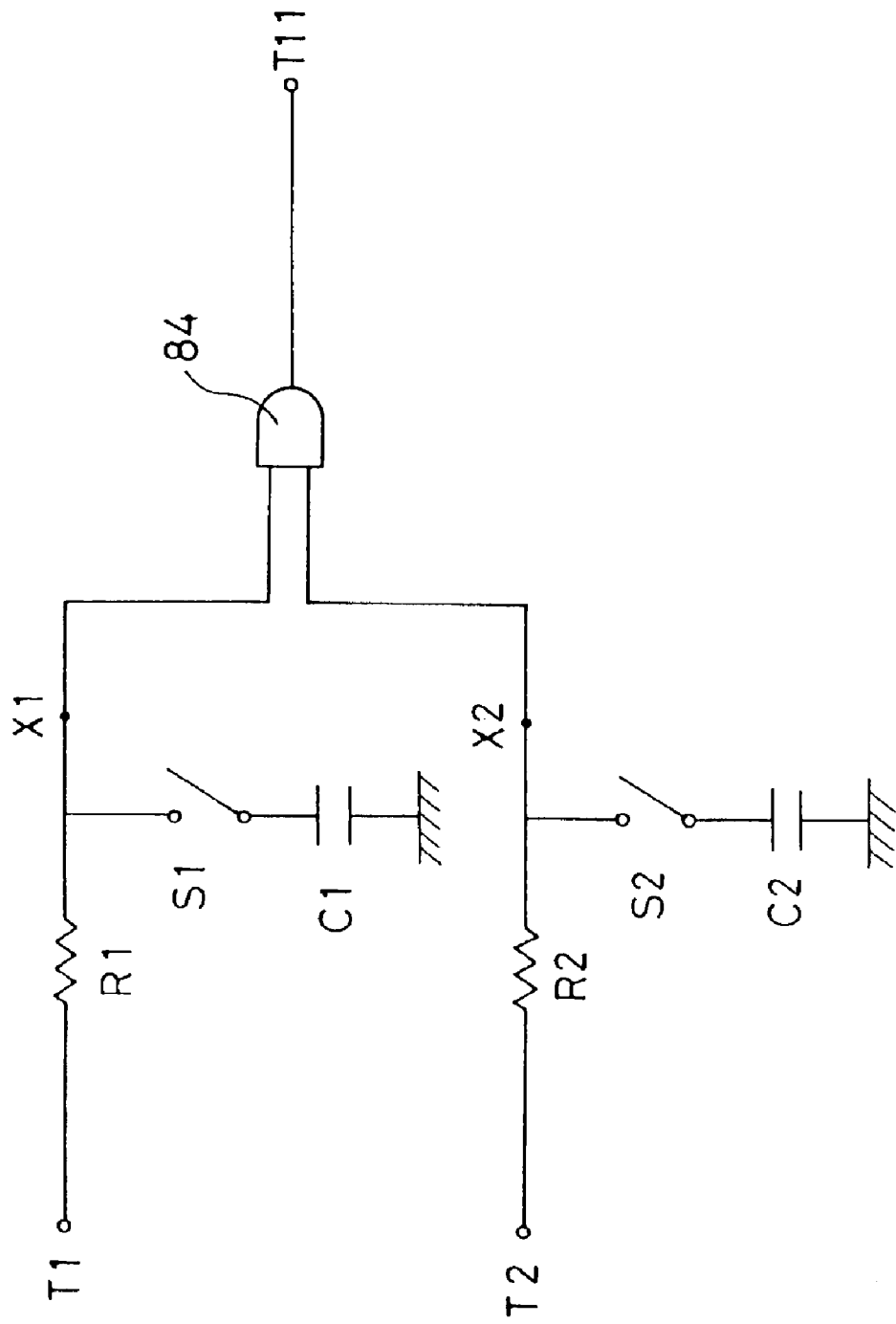
FIG. 15 is a circuit diagram showing a signal processing circuit for the X-axis direction components of a fourth variant of the capacitance type sensor shown in FIG. 1.

Next, a fourth variant of the first embodiment of the present invention will be described with reference to the drawing. FIG. 15 is a circuit diagram showing a signal processing circuit for the X-axis direction components of the capacitance type sensor according to the fourth variant. The signal processing circuit of FIG. 15 differs from the signal processing circuit of the capacitance type sensor of FIG. 1 in that in place of the EX-OR element, an AND element is used as the logical element. As the remaining constructions are the same as those of the capacitance type sensor 1 of FIG. 1, the description thereon will be omitted, with like numerals given to like parts.

In FIG. 15, when the portion of the detective member 30 corresponding to the X-axis positive direction is pressed down, the switch S1 is put in the ON-state. Then, when the portion of the detective member 30 corresponding to the X-axis positive direction is pressed down further, the cyclic signal A input to the terminal T1 passes through the CR delay circuit formed by the capacitance element C1 and the resistance element R1 and reaches the node X1. At this time, a predetermined delay is produced in the cyclic signal in the node X1, as shown in FIG. 9(e). Similarly, when the portion of the detective member 30 corresponding to the X-axis negative direction is pressed down, the switch S2 is put in the ON-state. Then, when the portion of the detective member 30 corresponding to the X-axis negative direction is pressed down further, the cyclic signal B input to the terminal T2 passes through the CR delay circuit formed by the capacitance element C2 and the resistance element R2 and reaches the node X2. At this time, a predetermined delay is produced in the cyclic signal in the node X2, as shown in FIG. 9(h).

Accordingly, the signals having the same waveform as the cyclic signals in the nodes X1, X2 are input to the AND element 84, for the logical operation OR between those signals and then the result is output to the terminal T11, as is the case with FIG. 8. It should be noted that the output signal output to the terminal T11 is a rectangular-wave signal having a specific duty ratio.

The duty ratio between the rectangular-wave signal output to the terminal 51 when the AND element 84 is used and the rectangular-wave signal output to the terminal 51 when the detective member 30 is not operated lessens in variation, as compared with that of the rectangular-wave signal output to the terminal 51 when the EX-OR element is used. This probably causes reduction in sensitivity of the capacitance type sensor.

Accordingly, when the components of the capacitance type sensor are made from material that can significantly modify the sensitivity of the capacitance type sensor, the AND element is preferably used to adjust the sensitivity of the capacitance type sensor (reduce the sensitivity in this variant) by the circuitry of the signal processing circuit.

Figure 16:
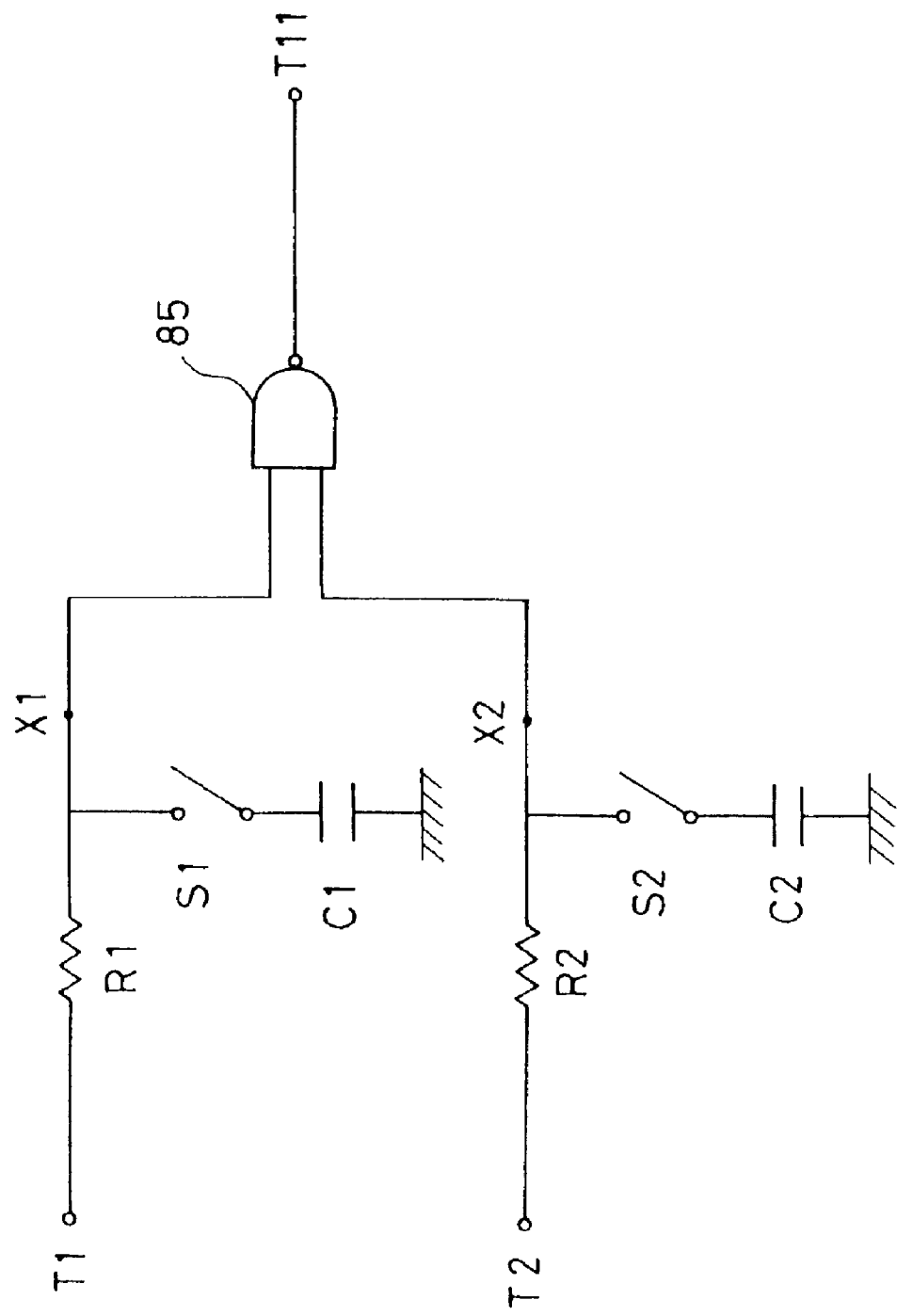
FIG. 16 is a circuit diagram showing a signal processing circuit for the X-axis direction components of a fifth variant of the capacitance type sensor shown in FIG. 1.

Next, a fifth variant of the first embodiment of the present invention will be described with reference to the drawing. FIG. 16 is a circuit diagram showing a signal processing circuit for the X-axis direction components of the capacitance type sensor according to the fifth variant. The signal processing circuit of FIG. 16 differs from the signal processing circuit of the capacitance type sensor of FIG. 1 in that in place of the EX-OR element, a NAND element is used as the logical element. As the remaining constructions are the same as those of the capacitance type sensor 1 of FIG. 1, the description thereon will be omitted, with like numerals given to like parts.

In FIG. 16, when the portion of the detective member 30 corresponding to the X-axis positive direction is pressed down, the switch S1 is put in the ON-state. Then, when the portion of the detective member 30 corresponding to the X-axis positive direction is pressed down further, the cyclic signal A input to the terminal T1 passes through the CR delay circuit formed by the capacitance element C1 and the resistance element R1 and reaches the node X1. At this time, a predetermined delay is produced in the cyclic signal in the node X1, as shown in FIG. 9(e). Similarly, when the portion of the detective member 30 corresponding to the X-axis negative direction is pressed down, the switch S2 is put in the ON-state. Then, when the portion of the detective member 30 corresponding to the X-axis negative direction is pressed down further, the cyclic signal B input to the terminal T2 passes through the CR delay circuit formed by the capacitance element C2 and the resistance element R2 and reaches the node X2. At this time, a predetermined delay is produced in the cyclic signal in the node X2, as shown in FIG. 9(h).

Accordingly, the signals having the same waveform as the cyclic signals in the nodes X1, X2 are input to the NAND element 85, for the logical operation OR between those signals, followed by a NOT operation, and then the result is output to the terminal T11, as is the case with FIG. 8. It should be noted that the output signal output to the terminal T11 is a rectangular-wave signal having a specific duty ratio.

The rectangular-wave signal output to the terminal 11 reduces in duty ratio averagely, as compared with the rectangular-wave signal output to the terminal 11 when the EX-OR element is used. This probably causes reduction in sensitivity of the capacitance type sensor.

Accordingly, when the components of the capacitance type sensor are made from material that can significantly modify the sensitivity of the capacitance type sensor, the NAND element is preferably used to adjust the sensitivity of the capacitance type sensor (reduce the sensitivity in this variant) by the circuitry of the signal processing circuit.

Next, the second embodiment of the present invention will be described with reference to the drawings.

Figure 17:
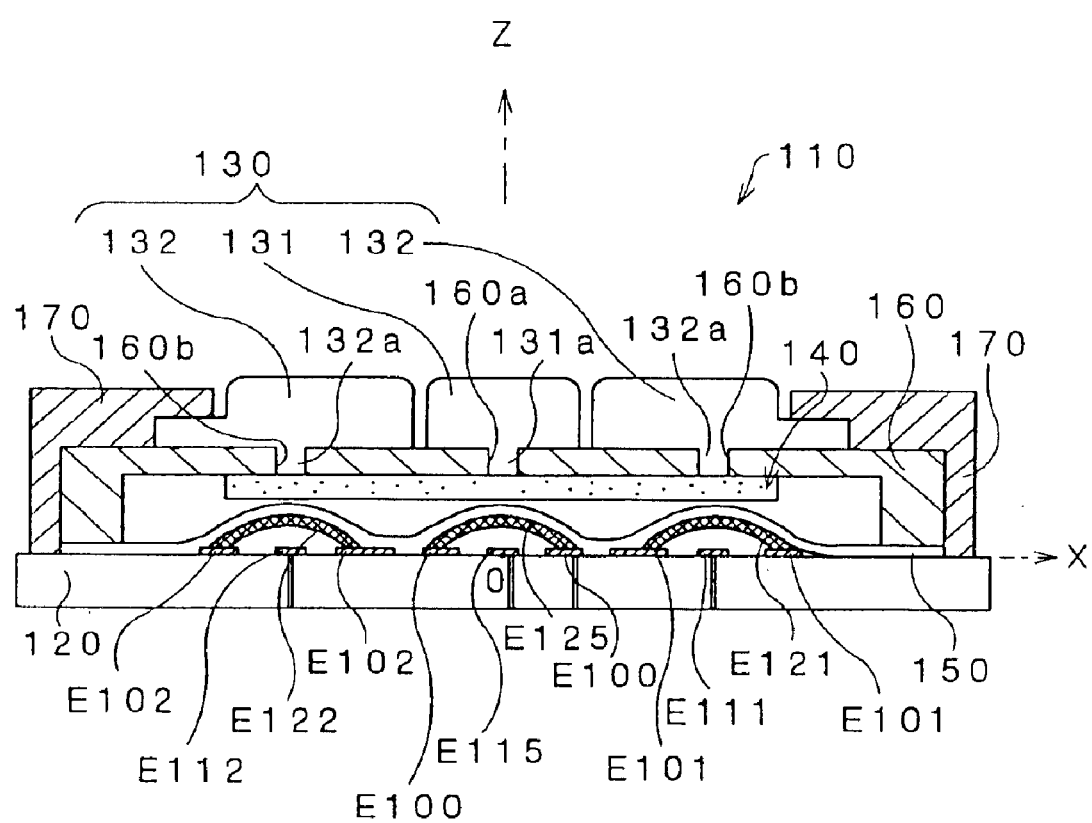
FIG. 17 is a schematic sectional view of a capacitance type sensor according to the second embodiment of the present invention.
Figure 18:
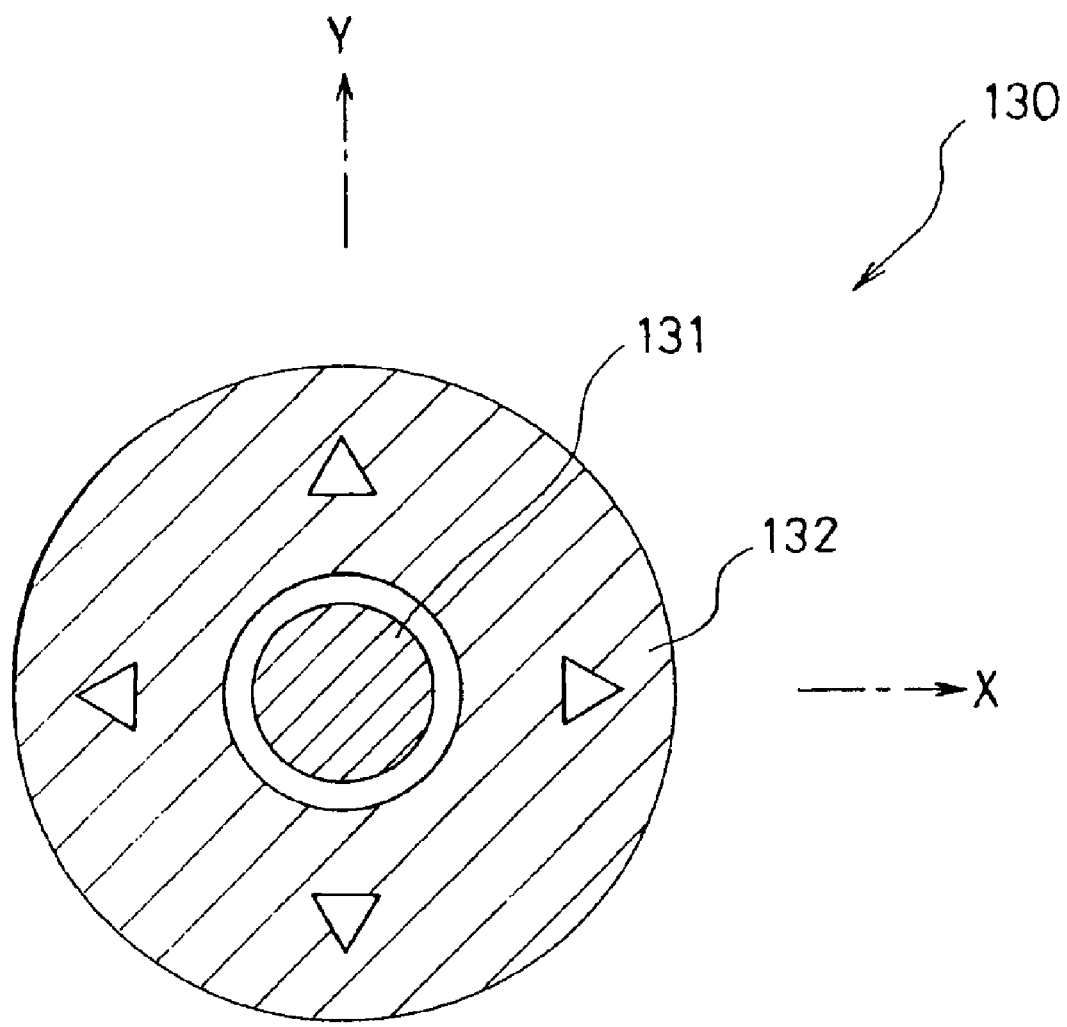
FIG. 18 is a top view of a detective member of the capacitance type sensor of FIG. 17.
Figure 19:
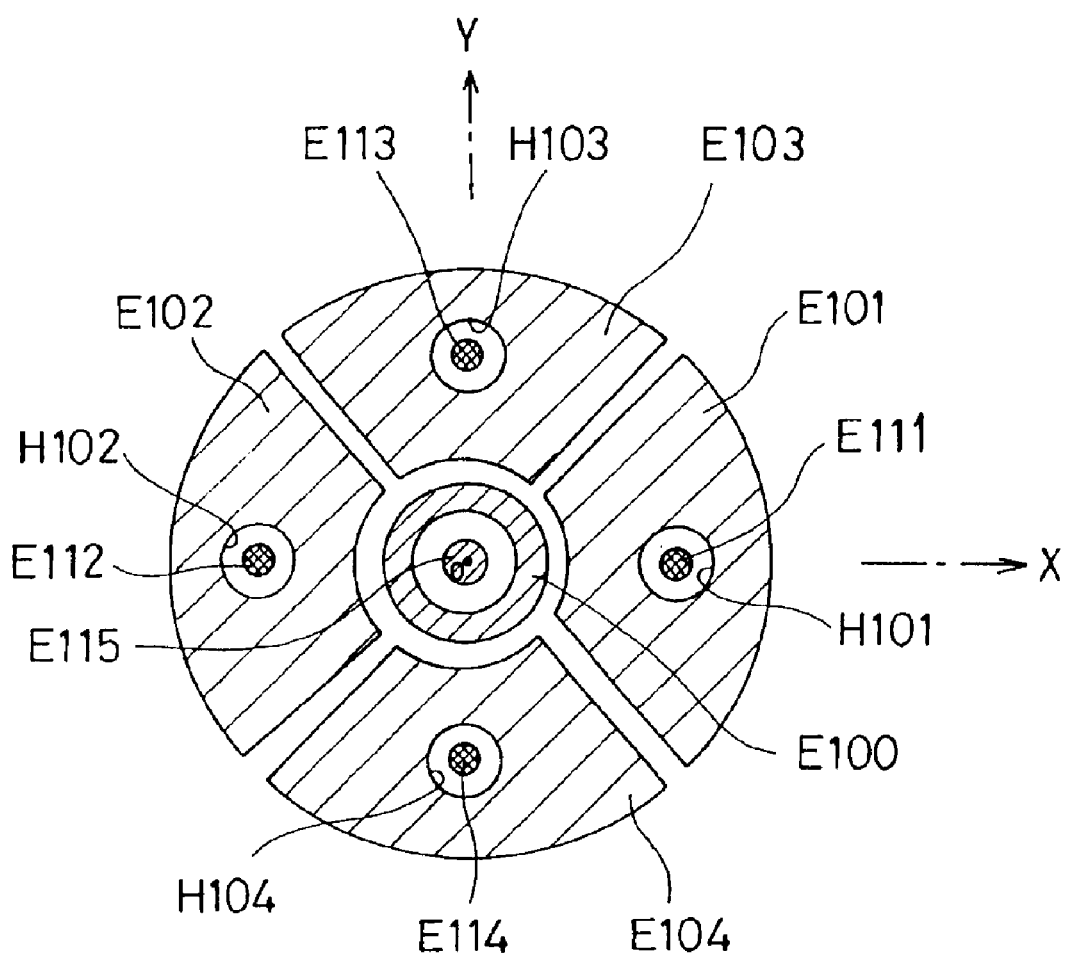
FIG. 19 is a view showing an arrangement of a plurality of electrodes formed on a substrate of the capacitance type sensor of FIG. 17.

FIG. 17 is a schematic sectional view of a capacitance type sensor according to another embodiment of the present invention. FIG. 18 is a top view of a detective member of the capacitance type sensor of FIG. 17. FIG. 19 is a view showing an arrangement of a plurality of electrodes formed on a substrate of the capacitance type sensor of FIG. 17.

A capacitance type sensor 110 has a substrate 120, an operating detective member 130 to which a force is applied from outside by an operator, a displacement electrode 140, capacitance element electrodes E101–E104 formed on the substrate 120, movable switch electrodes E121–E124 having a domed shape formed on the substrate 120 (only E121 and E122 are shown in FIG. 17), fixed switch electrodes E111–E114 arranged in the inside of the movable switch electrodes (only E111 and E112 are shown in FIG. 17), a reference electrode (common electrode) E100, a movable button electrode E125 having a domed form, a fixed button electrode E115 arranged in the inside of the movable button electrode E125, an insulating film 150 formed to be laid over the substrate 120 so as to be closely contacted with the plurality of electrodes, a supporting member 160 for fixedly supporting the detective member 130 and the displacement electrode 140 on the substrate 120, and a cover case 170 arranged around the supporting member 160 and the detective member 130.

For convenience of explanation, a XYZ three-dimensional coordinate system is defined herein, as illustrated, and the placement of the parts will be described with reference to this coordinate system. That is to say, in FIG. 17, the origin O is defined at the center of the fixed button electrode E115 on the substrate 120, letting the X-axis be in a horizontally rightward direction, the Z-axis be in a vertically upward direction, and the Y-axis be in a depth direction orthogonal to the vertical direction, when viewed from the paper. Therefore, a surface of the substrate 120 defines a plane XY, and the Z-axis passes center positions of the fixed button electrode E115, the detective member 130 and the displacement electrode 140.

The substrate 120 is a printed circuit board for an electronic circuit of a general type, as is the case with the substrate 20. In the illustrated example, a glass-epoxy substrate is used as the substrate. Although a film substrate formed, for example, of a polyimide film may be used as the substrate 120, since it has a nature of flexibility, it is preferably used in combination with a supporting board having sufficient rigidity on which the film substrate is placed.

The detective member 130 comprises a central button 131 of a circular form with center at the origin O, and a side button 132 of a ring form arranged around the outside of the ventral button 131. The central button 131 has a diameter substantially equal to or slightly smaller than an outer diameter of the reference electrode E100, and the side button 132 has an outer diameter substantially equal to a diameter of a circle formed by connecting outer curved lines of the capacitance element electrodes E101–E104. The central button 131 has a protrusion 131a formed on its lower surface at a position opposite to the fixed button electrode E115, and the side button 132 has four protrusions 132a formed on its lower surface at positions opposite to the fixed switch electrodes E111–E114, respectively.

The supporting member 160 formed of silicon rubber having elasticity has through holes 160a, 160b at positions corresponding to the protrusions 131a and 132a. The central button 131 is adhesive bonded to an upper surface of the supporting member 160, with its protrusion 131a fitted in the through hole 160a. The side button 132 is disposed on the upper surface of the supporting member 160 via a fall-off prevention structure, with its four protrusions 132a fitted in the through holes 160b, respectively. The side button 132 may alternatively be adhesive bonded to the upper surface of the supporting member 160.

The side button 132 has arrows formed on its upper surface, as shown in FIG. 18, to indicate operating directions (moving directions of a cursor). The arrows are oriented to the X-axis positive/negative direction and the Y-axis positive/negative direction, respectively, or are formed to correspond to the capacitance element electrodes E101–E104, respectively.

The displacement electrode 140 is formed of silicon rubber having conducting properties and is formed in a disc-like form having a diameter substantially equal to the diameter of the circle formed by connecting the outer curved lines of the capacitance element electrodes E101–E104. The displacement electrode 140 is adhesive bonded to the lower surface of the supporting member 160.

The displacement electrode 140 may be formed, for example, of conductive ink, conductive thermosetting resin (PPT, elastomer), conductive plastic, and metal evaporated film, as well as of silicon rubber. Since the displacement electrode 140 is formed to be flush with the lower surface of the supporting member 160, the displacement electrode 140 can be formed by screen-printing.

As shown in FIG. 19, the fixed button electrode E115 of a circular form with center at the origin O, the reference electrode E100 of a ring-like form formed around the outside of the fixed button electrode E115, the capacitance element electrodes E101–E104 of a sector form arranged around the outside of the reference electrode E100 and having circular holes H101–H104 formed around center portions thereof, and fixed switch electrodes E111–E114 of a circular form formed in the interior of the holes H101–H104 respectively and having diameter smaller than diameter of the holes H101–H104 are formed on the substrate 120. It is preferable that the fixed switch electrodes E111–E114 have as small area as possible, as compared with the area of the capacitance element electrodes E101–E104. A pair of capacitance element electrodes E101 and E102 are arranged in isolation with respect to the X-axis direction so as to be symmetric with respect to the Y-axis. A pair of capacitance element electrodes E103 and E104 are arranged in isolation with respect to the Y-axis direction so as to be symmetric with respect to the X-axis.

The capacitance element electrode E101 is arranged to correspond to the X-axis positive direction, and the capacitance element electrode E102 is arranged to correspond to the X-axis negative direction. The E101 and E102 are used for detecting the X-axis direction components of a force applied from outside. The capacitance element electrode E103 is arranged to correspond to the Y-axis positive direction, and the capacitance element electrode E104 is arranged to correspond to the Y-axis negative direction. The E103 and E104 are used for detecting the Y-axis direction components of the force applied from outside. Further, the fixed button electrode E15 is arranged on the origin O and is used for a determinate operation such as input, together with the moveable button electrode E125.

The reference electrode E100, the fixed switch electrodes E111–E114, and the fixed button electrode E115 are connected to terminals T100–T104 and a terminal T115 through the use of through holes and the like (See FIG. 20) and are connected to exterior electronic circuits through the terminals T100–T104 and the terminal 115. The reference electrode E100 is connected to ground through the terminal T100.

The movable switch electrodes E121–E124 are arranged in such a relation that they contact with the capacitance element electrodes E101–E104, respectively, but are spaced apart from and cover the fixed switch electrodes E111–E114. Thus, the movable switch electrodes E121–E124 are domed members having a diameter larger than a diameter of the holes H101–H104. Similarly, the movable button electrode E125 of a domed form is arranged in such a relation that it contacts with the reference electrode E100 but is spaced apart from and cover the fixed button electrode E115. Thus, the movable button electrode E125 has a diameter larger than an inner diameter of the reference electrode E100.

The insulating film 150 is laid over the substrate 120 in such a relation that it is closely contacted with a part of the capacitance element electrodes E101–E104, a part of the reference electrode E100, the moveable stitch electrodes E121–E124 and the movable button electrode E125 on the substrate 20. Thus, the insulating film 150 prevents the covered parts of the capacitance element electrodes E101–E104, reference electrode E100, moveable stitch electrodes E121–E124 and movable button electrode E125 formed from copper and the like from being exposed to air and accordingly it has the function of preventing oxidization of those electrodes. Also, the insulating film 150 prevents a direct contact between the movable switch electrodes E121–E124 and moveable button electrode E125 and the displacement electrode 140.

Figure 20:
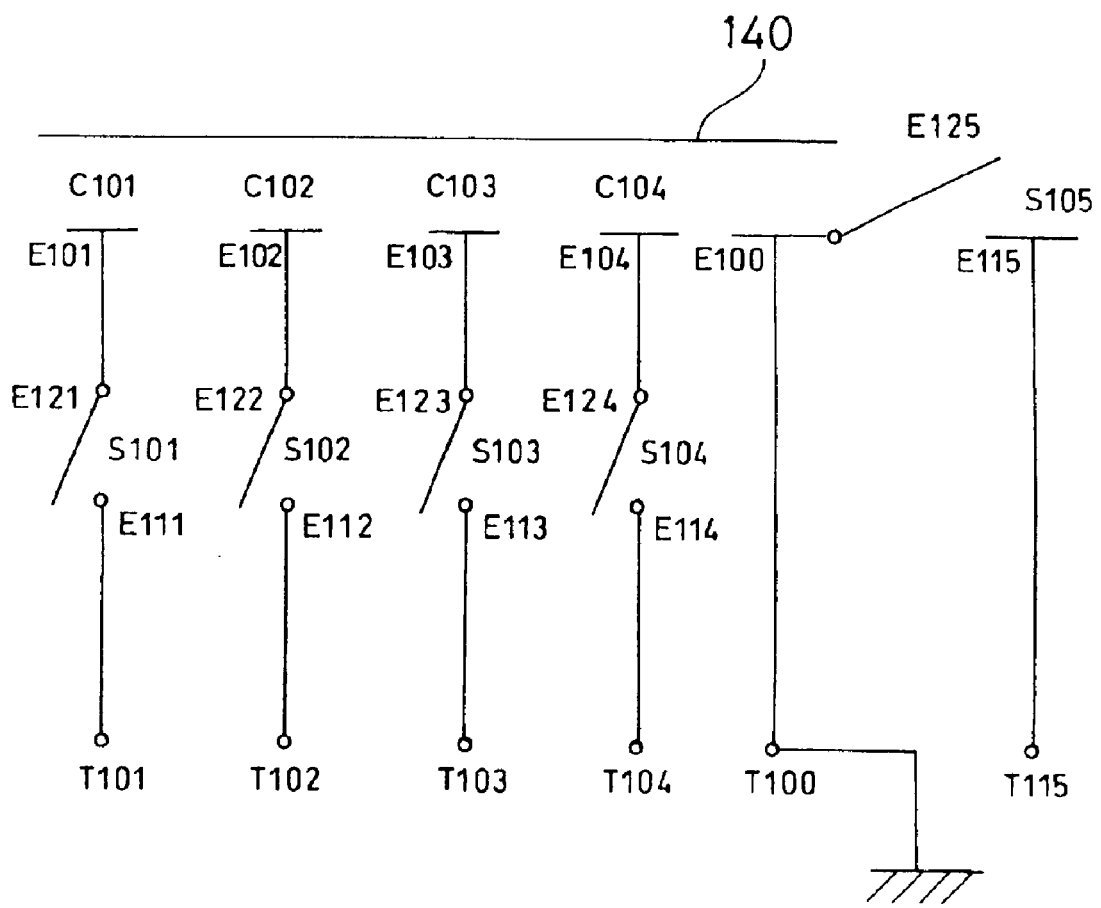
FIG. 20 is an equivalent circuit diagram for the construction of the capacitance type sensor shown in FIG. 17.
Figure 21:
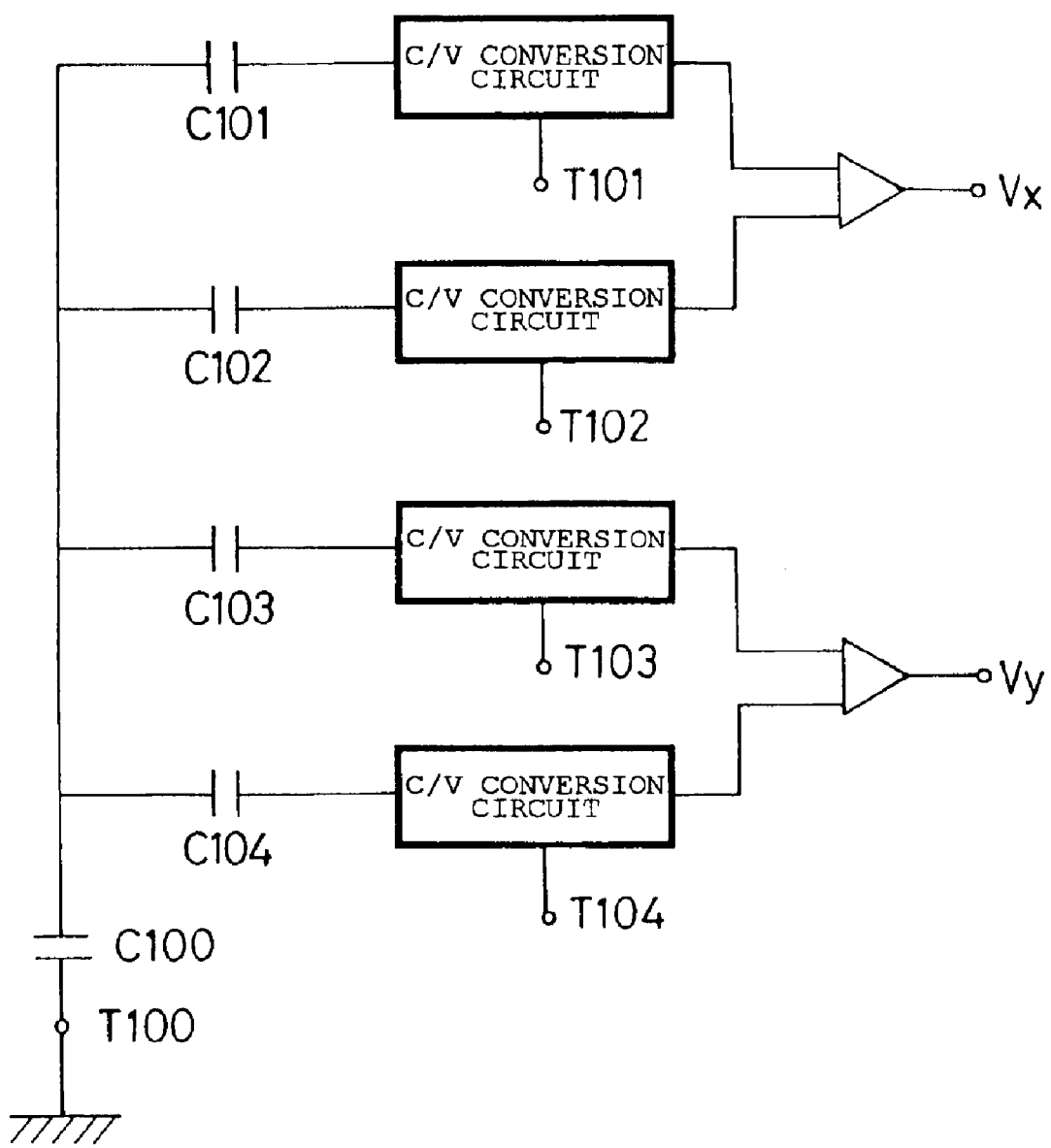
FIG. 21 is an illustration for explaining the way of deriving an output signal from a cyclic signal input to the capacitance type sensor shown in FIG. 17.
Figure 22:
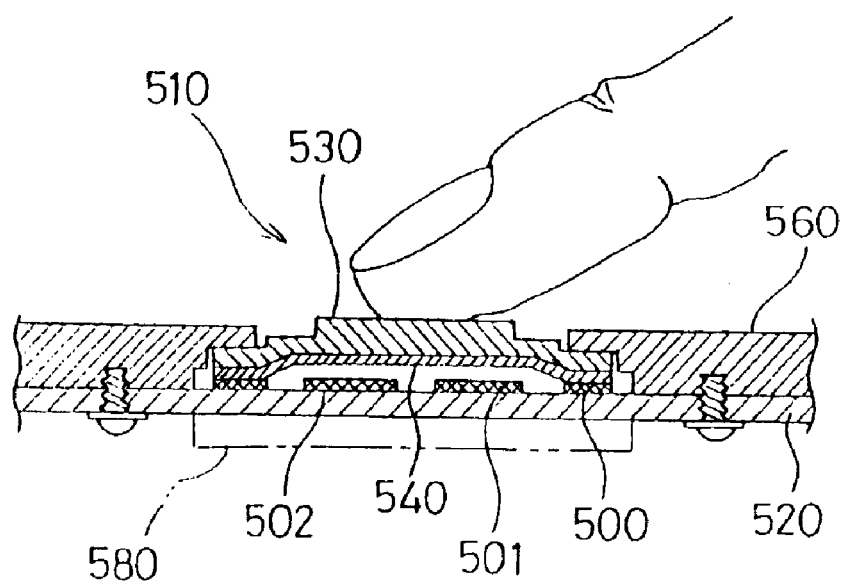
FIG. 22 is a schematic sectional view of a conventional capacitance type sensor.
Figure 23:
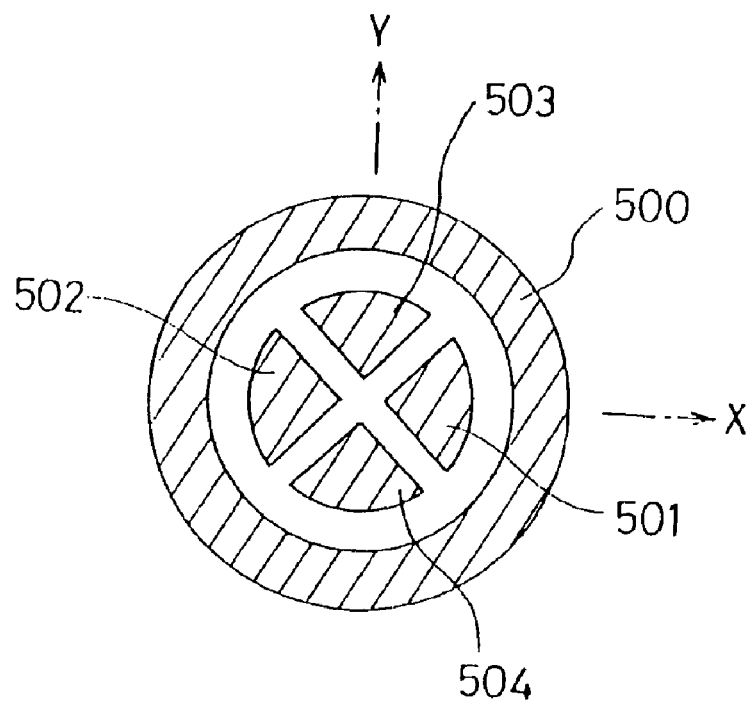
FIG. 23 is a view showing an arrangement of a plurality of electrodes formed on a substrate of the capacitance type sensor of FIG. 22.

Now, operation of the capacitance type sensor 110 thus constructed according to this embodiment will be described with reference to the drawings. FIG. 20 is an equivalent circuit diagram for the construction of the capacitance type sensor shown in FIG. 17. FIG. 21 is an illustration for explaining the way of deriving an output signal from a cyclic signal input to the capacitance type sensor shown in FIG. 17.

First, reference is made to the circuitry equivalent of the construction of the capacitance type sensor 110 with reference to FIG. 20. The capacitance element electrodes E101–E104 formed on the substrate 120 are opposite to the displacement electrode 140. The movable switch electrodes E121–E124 connected to the capacitance element electrodes E101–E104 have the function as switches S101–S104 that can selectively allow the connection between the terminals T101–T104 and the capacitance element electrodes E101–E104 by selecting its contact position with the fixed switch electrodes E111–E114 or the non-contact position therewith. The capacitance element C100 is formed between the reference electrode E100 (movable button electrode E125) and the fixed button electrode E115. Further, a switch S105 that is opened and closed with the press-down operation of the central button 131 is formed between the movable button electrode E125 connected to the reference electrode E100 and the fixed button electrode E115.

When the movable switch electrodes E121–E124 are not in contact with the fixed switch electrodes E111–E114 (OFF-state), the areas of the fixed switch electrodes E111–E114 are very small, as compared with the areas of the capacitance element electrodes E101–E104, or the movable switch electrodes E121–E124 serve as a kind of electrostatic shielding and, as a result, almost no capacitance is generated between the movable switch electrodes E121–E124 and the fixed switch electrodes E111–E114.

On the other hand, when the movable switch electrodes E121–E124 are in contact with the fixed switch electrodes E111–E114 (ON-state), the capacitance element electrodes E101–E104 are connected with the fixed switch electrodes E111–E114 and are made to be opposite to the displacement electrode 140, so that the capacitance elements C101–C104 are formed between the displaceable displacement electrode 140 that is the common electrode and the individual fixed capacitance element electrodes E101–E104. It can be said that the capacitance elements C101–C104 are variable capacitance elements that are each constructed to vary in capacitance value caused by displacement of the displacement electrode 140.

The respective capacitance values of the capacitance elements C101–C104 can be separately measured as the capacitance values generated between the displacement electrode 140 and the terminals T101–T104 connected to their respective capacitance element electrodes E101–E104. It is to be noted here that since the reference electrode E100 is connected to ground through the terminal T100, the displacement electrode 140 that is the common electrode for the capacitance elements C101–C104 is considered to be grounded.

Next, reference is made to the way of deriving an output signal showing magnitude and direction of a force applied from outside to the side button 132 from variations of the capacitance values of the capacitance elements C101–C104 when the movable switch electrodes E121–E124 and the fixed switch electrodes E111–E114 are in contact with each other (the switches S101–S104 are in the ON-state), with reference to FIG. 21. It is to be noted that the output signals Vx, Vy indicate the magnitude and direction of an X-axis direction component of the force applied from outside and the magnitude and direction of a Y-axis direction component of the force applied from outside, respectively.

In order to derive the output signals Vx, Vy, cyclic signals, such as clock signals, are input to the terminals T101–T104 all the time. When the side button 132 is displaced by a force from outside in the state in which the cyclic signals are being input to the terminals T101–T104, the displacement electrode 140 is displaced in the Z-axis direction with the displacement of the side button. When the applied force does not reach a predetermined value, the movable switch electrodes E121–E124 are not displaced substantially. On the other hand, when the applied force reach the predetermined value, the movable switch electrodes E121–E124 are elastically deformed and depressed drastically with buckling at nearly top portion thereof and are brought into contact with the fixed switch electrodes E111–E114. This brings the switches S101–S104 into the ON-state. At this time, the operator is given a pronounced click feeling. Thereafter, when the side button 132 is displaced further, the displacement electrode 140 is deformed further, while the switches S101–S104 are kept in the ON-state. As a result, the distance between the electrodes of each the capacitance elements C101–C104 varies and thereby the capacitance value of each of the capacitance elements C101–C104 varies. Then, phase lags in the cyclic signals input to the terminals T101–T104 are produced. By using the phase lags produced in the cyclic signal, the output signals Vx, Vy can be obtained which show the displacement of the side button 132, i.e., the magnitude and direction of the force applied to the side button 132 from outside for the X-axis direction and the magnitude and direction of the force applied thereto from outside for the Y-axis direction, respectively. As the output signal deriving way is the same as that discussed on the signal processing circuit in the capacitance type sensor of FIG. 1, the detailed explanation thereof is omitted.

As mentioned above, according to the capacitance type sensor 110 of this embodiment, when the operator operates the side button 132, the movable switch electrodes E121–E124 corresponding to the operating directions are elastically deformed with a click feeling and also the sensor 110 does not recognize the displacement of the side button 132 until the movable switch electrodes E121–E124 are contacted with the fixed switch electrodes E111–E114. Therefore, when the operator feels a click, he/she can easily comprehend from the click feeling that he/she is actually carrying out the operation. Also, since the sensor 110 does not recognize the displacement of the side button 132 until an external force enough to make the operator feel a click is applied to the side button 132, when the operator unintentionally or unconsciously applies to the side button 132 an external force which is too small for the operator to feel a click, the sensor 110 does not recognize the displacement of the side button 132. Therefore, a possible disturbance, such as a happening that the side button 132 happens to contact with another member, is avoided, so that only the displacement of the side button 132 caused by the operator's intentional operation is surely detected. In this embodiment, the operator is given the click feeling when the movable button electrode E125 and the fixed button electrode E115 are contacted with each other as well.

Also, the plurality of capacitance element electrodes E101–E104 are formed so that the X-axis direction components and the Y-axis direction components of the force applied to the side button 132 from outside can be recognized separately. In addition, since signals with different phases are fed to the paired capacitance element electrodes (E101 and E102, and E103 and E104), the phase lag of the signal, when passing through the circuit, can be increased. Further, since the signal processing circuit using the logical element is used, the signal can be detected with high precision.

Also, since the input device with the determinate operation switch (central button 131) can be produced, the operator, when performing the determinate operation, can comprehend a pronounced operational click feeling to prevent wrong operation. In addition, since the detective member 130 is divided into the central member 131 and the side button 132, the external force applied to the side button 132 from the side corresponding to the operating direction and the external force applied to the central button 131 from the side corresponding to the determinate operation are distinctly separated. This can prevent those forces from being interfered with each other, to reduce the wrong operation. The capacitance type sensor thus constructed is preferably used as the input device of personal computer, mobile phone, game, and the like.

The displacement electrode 140 is electrically connected with the grounded reference electrode E100 via a capacitive coupling formed by the capacitive element C100 (which has the function of coupling condenser), not via a direct contact. This can provide an improved withstand voltage of the capacitance type sensor 110, thus practically eliminating the possibility that the sensor may be damaged by a spark current flowing through the sensor, and also can prevent a possible failure such as a bad connection. Therefore, the capacitance type sensor with improved reliability can be obtained. Also, although the insulating film 150 is arranged between the reference electrode E100 and the displacement electrode 140, since there is no need to cut part of the insulating film 150 to bring the reference electrode E100 and the displacement electrode 140 into contact with each other, advantageous effects can be produced in assembly and mounting aspects.

Although the preferred embodiments of the present invention have been described above, the present invention is not limited to the illustrated embodiments. Various design changes may be made in the invention within the scope of the claimed invention. For example, while the first embodiment mentioned above is constructed so that the reference electrode formed in the inside of the capacitance element electrodes and the protrusion formed on the lower surface of the displacement electrode at a center thereof are contacted with each other, modification may be made such as, for example, by forming a reference electrode around the outside of the capacitance element electrodes and forming a protrusion formed on the lower surface of the displacement electrode around an outside edge thereof, so that the reference electrode and the protrusion are contacted with each other. Accordingly, any proper construction may be adopted, as long as the reference electrode and the displacement electrode are electrically connected with each other.

Although in the first and second embodiments mentioned above, the electrodes having a domed form are used as the movable switch electrodes, any form may be used for the movable switch electrodes, as long as it is the form that can be elastically deformed with a click feeling along with the displacement of the displacement electrode to contact with the fixed switch electrode.

Although in the first and second embodiments mentioned above, the fixed switch electrode is formed in the inside of the capacitance element electrodes, the fixed switch electrode may be formed to be adjacent to the capacitance element electrodes.

Although in the first and second embodiments mentioned above, the detective member is formed in one piece for the capacitance element electrodes arranged in correspondence to the X-axis direction and the Y-axis direction, the detective member may be divided into parts to correspond to the capacitance element electrodes arranged in correspondence to the X-axis direction and the Y-axis direction.

Although in the first and second embodiments mentioned above, the four capacitance element electrodes are formed to correspond to four directions of the X-axis positive/negative directions and Y-axis positive/negative directions, the capacitance type sensor may be formed so that only a required direction component can be detected for the purpose.

CAPABILITIES OF EXPLOITATION IN INDUSTRY

The capacitance type sensor of present invention can make it easy for the operator to sensuously comprehend that he/she is actually carrying out the operation and, accordingly, is most suitably used as an input device of a personal computer, a mobile phone, a game, and the like.

What is claimed is:

1. A capacitance type sensor comprising:

a substrate;

a displaceable detective member facing the substrate;

a conductive member disposed between the substrate and the detective member, wherein the conductive member is displaceable in a direction perpendicular to a plane of the substrate in accordance with displacement of the detective member;

a reference electrode disposed on the substrate and electrically connected with the conductive member, wherein the reference electrode is at a predetermined electric potential;

a first electrode disposed on the substrate;

a second electrode disposed on the substrate to constitute a first capacitance element with the conductive member; and a third electrode electrically connected with the second electrode, wherein the third electrode is contactable with the first electrode, elastically deforming in accordance with displacement of the conductive member, and wherein, when the first electrode and the third electrode are in contact with each other a signal input to the first electrode is used to identify the displacement of the detective member on the basis of changes in capacitance of the first capacitance element caused by changes in distances between the conductive member and the second electrode.

2. The capacitance type sensor according to claim 1, wherein the third electrode is formed in a domed shape and the first electrode is arranged therein.

3. The capacitance type sensor according to claim 1, wherein a second capacitance element is disposed between the reference electrode and the conductive member.

4. The capacitance type sensor according to claim 1, wherein there are provided two or more groups of the first, second and third electrodes.

5. The capacitance type sensor according to claim 1, which has two groups of the first, second and third electrodes and wherein signals with different phases are fed to a circuit including one of the two groups of electrodes and a circuit including the other of the two groups of electrodes.

6. The capacitance type sensor according to claim 1, which has two groups of the first, second and third electrodes and wherein a CR circuit including one of the two groups of electrodes and a CR circuit including the other of the two groups of electrodes are different in time constant from each other.

7. The capacitance type sensor according to claim 1, which has two groups of the first, second and third electrodes and wherein output signals of signals input to the circuit including one of the two groups of electrodes and the circuit including the other of the two groups of electrodes, respectively, are detected by a signal processing circuit using a logical element.

8. The capacitance type sensor according to claim 7, wherein the logical element performs an exclusive-OR logical operation.

9. The capacitance type sensor according to claim 7, wherein the logical element performs a logical operation OR.

10. The capacitance type sensor according to claim 7, wherein the logical element performs a logical operation AND.

11. The capacitance type sensor according to claim 7, wherein the logical element performs a logical operation AND and a NOT operation.

12. The capacitance type sensor according to claim 1, wherein the second electrode includes a pair of fourth electrodes arranged to be symmetric with respect to a first axis that is defined in the plane of the substrate and a pair of fifth electrodes arranged to be symmetric with respect to a second axis that is perpendicular to the first axis and defined in the plane of the substrate.

13. The capacitance type sensor according to claim 12, wherein the detective member is divided to correspond to the fourth electrodes and the fifth electrodes, respectively.

14. The capacitance type sensor according to claim 1, further comprises:

a sixth electrode formed on the substrate, and a seventh electrode arranged to be contactable with the reference electrode and spaced apart from the sixth electrode, the seventh electrode being elastically deformable along with displacement of the conductive member, to contact with the sixth electrode.

15. The capacitance type sensor according to claim 14, wherein the detective member is divided to correspond to the second electrodes and the sixth electrodes, respectively.

16. The capacitance type sensor according to claim 1, wherein the conductive member is formed by conductive ink applied to an elastic member.

* * * * *